US008023928B2

(12) United States Patent
Fulks, III et al.

(10) Patent No.: US 8,023,928 B2
(45) Date of Patent: Sep. 20, 2011

(54) SYSTEM AND METHOD FOR MONITORING AN ANALOG DATA SIGNAL

(75) Inventors: Charles E. Fulks, III, Madison, AL (US); Ray Kendall, Huntsville, AL (US); Alan W. Segrest, Huntsville, AL (US); Mark D. Roberts, Huntsville, AL (US)

(73) Assignee: Intuitive Research and Technology, Huntsville, AL (US)

( * ) Notice: Subject to any disclaimer, the term of this patent is extended or adjusted under 35 U.S.C. 154(b) by 849 days.

(21) Appl. No.: 12/007,880

(22) Filed: Jan. 16, 2008

(65) Prior Publication Data

US 2009/0181636 A1    Jul. 16, 2009

(51) Int. Cl.
*H04B 1/16* (2006.01)
*G08B 21/00* (2006.01)

(52) U.S. Cl. ............ 455/414.1; 340/870.16; 324/378

(58) Field of Classification Search ............ 455/41.2, 455/67.11, 90.1, 90.3, 414.1; 701/29, 30; 324/378, 380, 399, 384
See application file for complete search history.

(56) References Cited

U.S. PATENT DOCUMENTS

| | | | |
|---|---|---|---|
| 5,350,412 A | 9/1994 | Hoegnelid et al. | |
| 5,479,932 A | 1/1996 | Higgins et al. | |
| 5,602,749 A * | 2/1997 | Vosburgh | 700/174 |
| 5,675,257 A | 10/1997 | Frus | |
| 5,710,723 A | 1/1998 | Hoth et al. | |
| 6,115,726 A | 9/2000 | Ignjatovic | |
| 6,255,962 B1 * | 7/2001 | Tanenhaus et al. | 340/870.05 |
| 6,388,444 B1 * | 5/2002 | Hahn et al. | 324/378 |
| 6,469,639 B2 * | 10/2002 | Tanenhaus et al. | 340/870.16 |
| 6,608,572 B1 | 8/2003 | Venkitachalam et al. | |
| 6,691,007 B2 * | 2/2004 | Haugse et al. | 701/29 |
| 7,080,555 B2 | 7/2006 | Austin et al. | |
| 7,154,275 B2 * | 12/2006 | Zank et al. | 324/457 |
| 7,154,398 B2 | 12/2006 | Chen et al. | |
| 2003/0236077 A1 | 12/2003 | Sivard | |
| 2007/0185664 A1 * | 8/2007 | Tanaka et al. | 702/56 |
| 2008/0146890 A1 * | 6/2008 | LeBoeuf et al. | 600/300 |
| 2009/0046739 A1 * | 2/2009 | Ebling et al. | 370/465 |

OTHER PUBLICATIONS

Calvert et al., "Bridge Structural Health Monitoring System Using Fiber Grating Sensors: Development and Preparation for a Permanent Installation," Blue Road Research, 11 pgs.
Meng et al., "Development of a Prototype Remote Structural Health Monitoring System (RSHMS)", Session 4—Structural Health Monitoring of Bridges, 11 pgs. (2004).
"Impact & Environmental Recorders," www.agmcontainer.com, Shockwatch, 2 pgs.

* cited by examiner

*Primary Examiner* — Blane J Jackson
(74) *Attorney, Agent, or Firm* — Venable LLP; Robert S. Babayi

(57) ABSTRACT

A system and method for monitoring an analog data signal is provided that includes an analog data compression subsystem. The analog data compression subsystem includes a frequency bandpass filter, a rectifier, and an integrator such as a leaky integrator or one that is reset after being sampled. An analog data signal is bandpass filtered by the frequency bandpass filter, rectified, and integrated in the analog domain. The output of the integrator is converted into a digital data value by an analog-to-digital converter circuit that samples the integrator at a desired sample rate or duty cycle. The output of the integrator can trigger an event based upon established criteria. Multiple analog data compression subsystems can be used in parallel to monitor multiple frequency bands-of-interest.

21 Claims, 32 Drawing Sheets

US 8,023,928 B2

SYSTEM AND METHOD FOR MONITORING AN ANALOG DATA SIGNAL

FIELD OF THE INVENTION

The present invention relates generally to a system and method for monitoring an analog data signal and more particularly to monitoring an analog data signal that represents the health of a system.

BACKGROUND OF THE INVENTION

A health monitoring system (HMS) in general monitors one or more parameters corresponding to the health of a system. Such parameters may pertain to the system environment, which are typically represented as analog data signals that may also be referred to as raw data, raw analog data signals, analog information signals, analog data streams, or analog information streams. Exemplary parameters that are represented by such analog data signals include temperature, humidity, radioactivity, PH, etc. Such parameters may also be represented by analog data signals relating to physical properties of a system, for example, loading, stress, strain, acceleration, etc. Certain properties may be measured relative to one or more directions or axes.

FIG. 1a illustrates an exemplary prior art HMS 100 for processing a raw analog data signal. Referring to FIG. 1a, a sensor 102 outputs an analog data signal 104 that is conditioned by a signal conditioning circuit (or conditioner) 106 to produce a conditioned analog data signal 108 that is inputted into an analog-to-digital converter circuit (or A/D converter) 110. Optionally, analog data signal 104 can be inputted directly into the analog-to-digital converter circuit 110. The analog-to-digital converter circuit 110 includes a sample-and-hold circuitry and provides a digital data signal 120 to a processor 112. The processor 112 stores and retrieves digital data signal 120 values using a memory 116 and interfaces with a clock 118. The conditioned analog data signal 108 may also be input into a raw analog data trigger device (or trigger) 114 that compares the conditioned analog data signal 108 to a determined, or established, threshold value, or any other comparison criteria, and triggers a raw analog data event signal 122 to processor 112 when the conditioned analog data signal 108 is greater than or equal to the threshold value or when the comparison criteria is met in any manner.

The conditioning circuitry 106 may comprise an operational amplifier used to amplify analog data signal 104 to an appropriate voltage required for proper operation of the analog-to-digital converter circuit 110. Generally, the conditioning circuitry 106 may comprise circuitry intended for amplification, filtering, converting, and any other processes required to make sensor output suitable for conversion to a digital format. A raw analog data trigger device 114 would typically comprise a comparator. As such, the prior art health monitoring system can be described as a system that produces analog data signals corresponding to sensor measurements, conditions the analog data signals to enable conversion to a digital format, and converts the analog sensor measurements to digital sensor measurements, which are stored in memory for post processing. The prior art health monitoring system may also trigger an event if an analog sensor measurement meets or exceeds an established threshold. It should be noted that in FIG. 1a, the raw analog data trigger device 114, raw analog data event signal 122, the input of analog data signal 104 into analog-to-digital converter circuit 110, and the input of conditioned analog data signal 108 into raw analog data trigger device 114 are depicted using dashed lines to indicate that they are optional. Dashed lines are also used in several subsequent figures to indicate options.

FIG. 1b illustrates an exemplary prior art health monitoring method 130 for processing a raw analog data signal. Referring to FIG. 1b, health monitoring method 130 comprises several steps intended to store individual samples of a raw analog data signal. In a first step 132, an analog data signal is obtained, for example, from a sensor. In a second step 134, which may or may not be required, the analog data signal is conditioned, for example amplified, thereby producing a conditioned analog data signal. The conditioned analog data signal is then converted in a third step 136 to a digital data value, the digital data value corresponding to a discrete sample of the analog data signal. In a fourth step 138, the digital data value is stored in a memory, for example, a hard drive. A time stamp may be stored along with each digital data value or a reference time may be associated with multiple sample values, for example, multiple samples sampled at a defined sampling rate relative to a determined reference time. An optional step 140 of method 130 is to compare the conditioned analog data signal to a threshold and, if it meets (or exceeds) the threshold, another optional step 142 is performed, which is to trigger a raw analog data event (or event). Triggering an event could be setting off an alarm, shutting down a system, varying a parameter of the system, changing the rate at which the analog data signal is being sampled, for example, increasing the sampling rate for some period of time in order to more precisely capture the aftermath of the triggered event in greater detail, or any other defined action or process.

An exemplary HMS scenario involves the monitoring of vibrations in the tail rotor of a helicopter; where it is desirable to detect operational anomalies prior to rotor failure. A typical vibration monitor used to monitor vibration in the tail rotor may sample vibrations represented by an analog data signal at the rate of 20,000 samples per second, which for a 3 hour flight corresponds to 72,000,000 samples. Clearly, the data storage and processing requirement for 3 hours of such sampled raw data is significant. Thus, long term monitoring of the health of a system using sampled raw data can require power and memory resources that are often cost prohibitive. Moreover, the huge amounts of raw data produced by an existing HMS when used for long term monitoring of the health of a system often requires significant data storage resources, and the computational resources and significant time required to process such amounts of raw data make real time assessment of the health of a system impractical to achieve under many health monitoring scenarios.

Generally, as the amount of raw analog data pertaining to the monitoring of a system increases, power storage and processing requirements also increase so it becomes more and more difficult to make a real time assessment of the health of the monitored system. Therefore, there exists a need for an improved system and method for monitoring of an analog data signal.

SUMMARY OF THE INVENTION

Briefly, the present invention is an improved system and method for monitoring an analog data signal obtained from a source, for example, a sensor. Such an analog data signal received from a source is referred to herein as a raw analog data signal. The invention involves analyzing a frequency content of a raw analog data signal in one or more frequency ranges and integrating at least part of energy in the one or more frequency ranges. More specifically, the system and method according to the present invention band pass filters a raw analog data signal that may or may not have received some conditioning, for example, amplification. The bandpass filtered analog signal is then rectified and the rectified bandpass filtered analog signal is then integrated. The resulting integrated analog signal is processed with significantly less power, data storage, and computational requirements than of the prior art approach to processing the raw analog data signal.

The improved monitoring system of the invention includes an analog data compression subsystem. In one exemplary embodiment, the analog data compression subsystem comprises a bandpass frequency filtering device that receives a conditioned analog data signal and outputs a bandpass filtered analog data signal into a signal rectifying device. The signal rectifying device rectifies the bandpass filtered analog data signal to produce a rectified bandpass filtered analog data signal that is input into an integrator device, which outputs an integrated bandpass filtered analog data signal that can be converted into a digital data signal, stored in a memory, and processed accordingly.

An exemplary method according to the present invention includes the steps of obtaining an analog data signal, conditioning the analog data signal, bandpass filtering the conditioned analog data signal, rectifying the bandpass filtered analog data signal, and integrating the rectified bandpass filtered analog data signal. Thereafter, the integrated bandpass filtered analog data signal can be converted to digital data signal values that can be stored in a memory and processed accordingly.

According to some of the more detailed features of the invention, the integrated bandpass filtered analog data signal is applied to an integrated analog data trigger device that compares the integrated bandpass filtered analog data signal to a trigger criteria, such as a determined threshold value, and triggers an event signal to a processor when the integrated bandpass filtered analog data signal meets the trigger criteria. For example, the integrated bandpass filtered analog data signal can be compared to a threshold and, if it meets (or exceeds) the threshold, an integration event is triggered.

According to other detailed features of the invention, an integrated bandpass filtered analog data signal (or corresponding digital data value) is assessed relative to normal integrated bandpass filtered analog data signal behavior where at least one rule is established based upon at least one acceptable value and/or at least one unacceptable value.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 2b depicts a data flow diagram corresponding to the first analog data compression subsystem depicted in FIG. 2a;

FIG. 5b depicts a data flow diagram corresponding to the second analog data compression subsystem depicted in FIG. 5a;

DETAILED DESCRIPTION OF THE INVENTION

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art. Like numbers refer to like elements throughout.

The present invention provides an improved system and method for monitoring of an analog data signal (or analog data stream) that is far superior to the sample raw data and process approach generally practiced by the prior art. Specifically, the present invention provides an improved system and method for monitoring an analog data signal where the analog data signal is bandpass filtered, rectified, and integrated by an analog data compression subsystem to compress the raw analog data signal prior to digital data acquisition and processing. In an exemplary embodiment, an improved HMS, such as the one shown FIG. 4a and described in more detail below, receives a raw analog data signal corresponding to sensor measurements of a parameter corresponding to the health of a system, for example, vibration, temperature, stress, etc., and reduces and simplifies data processing requirements by compressing the raw analog data signals by bandpass filtering, rectifying, and integrating the analog data signals.

Figure 2A:
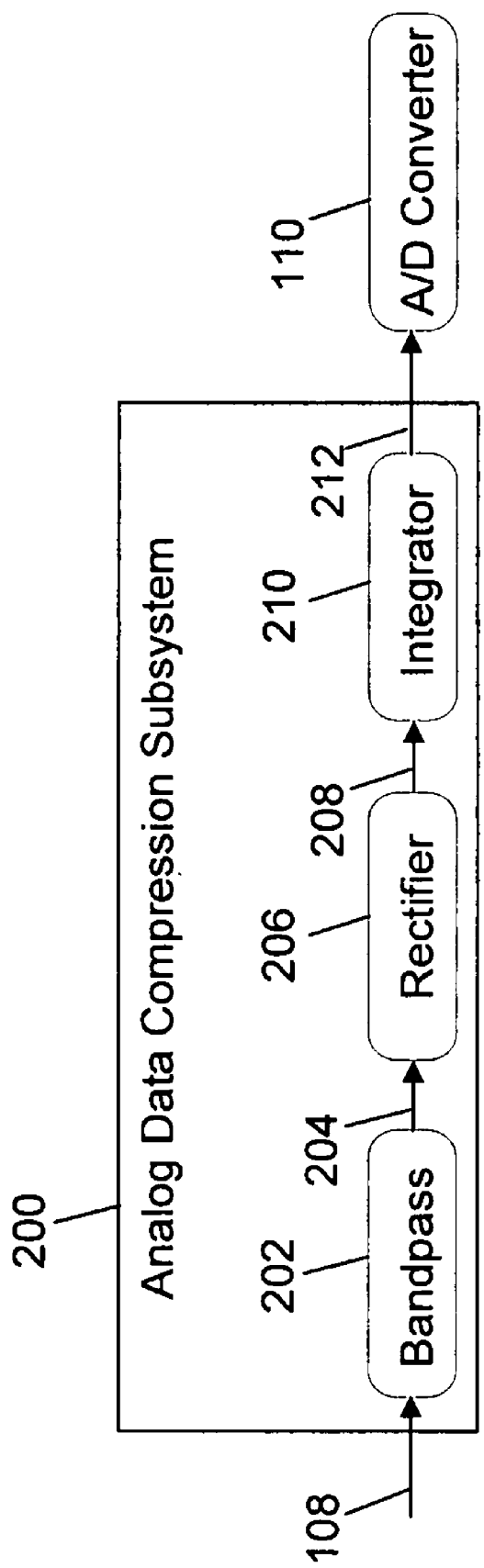
FIG. 2a depicts a first analog data compression subsystem used in accordance with a first embodiment of the present invention.
Figure 3A:
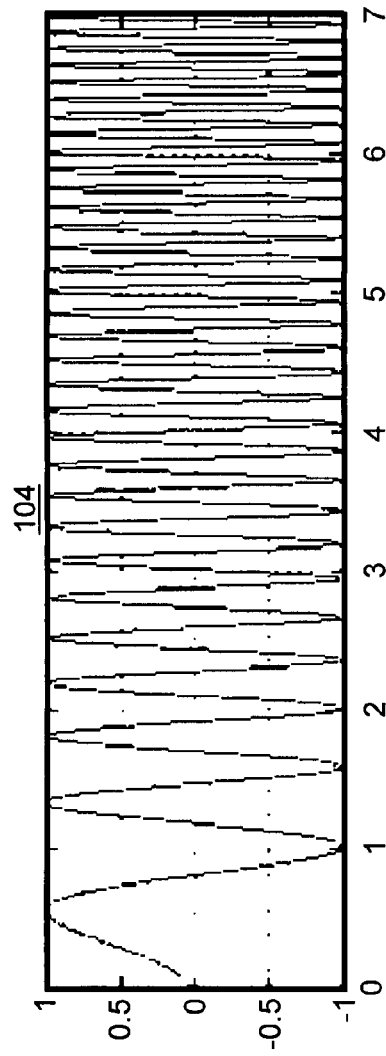
FIG. 3a depicts an exemplary increasing frequency chirp analog data signal.
Figure 3B:
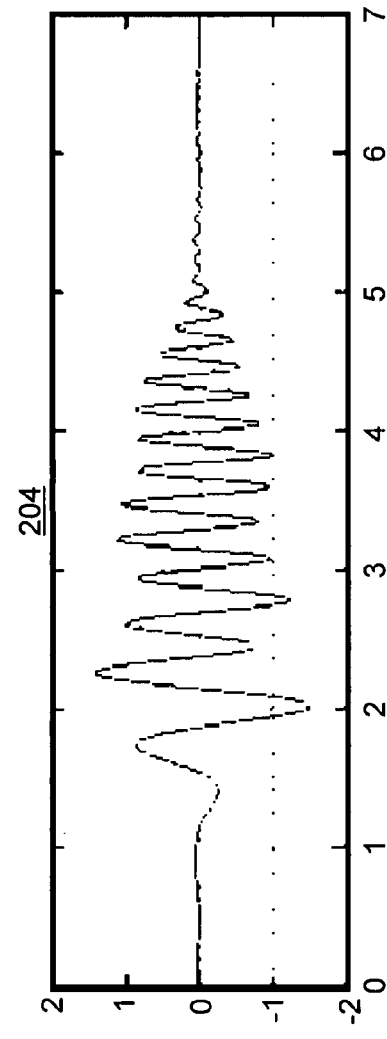
FIG. 3b depicts an exemplary bandpass filtered analog data signal.
Figure 3C:
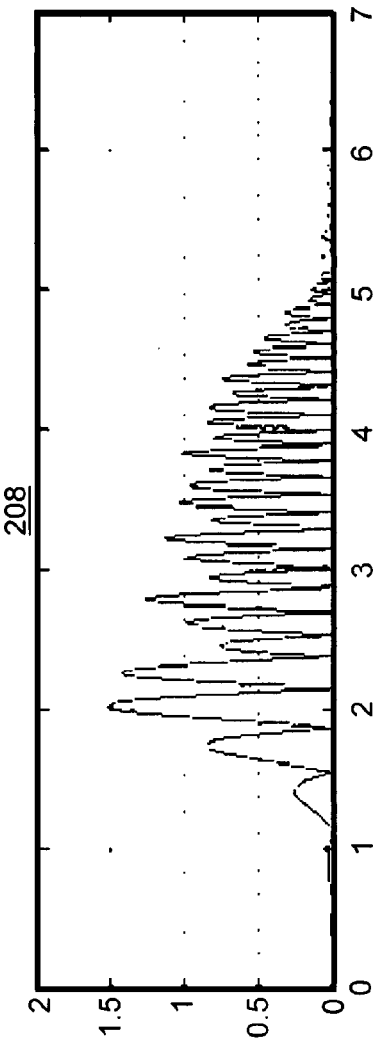
FIG. 3c depicts an exemplary rectified bandpass filtered analog data signal.
Figure 3D:
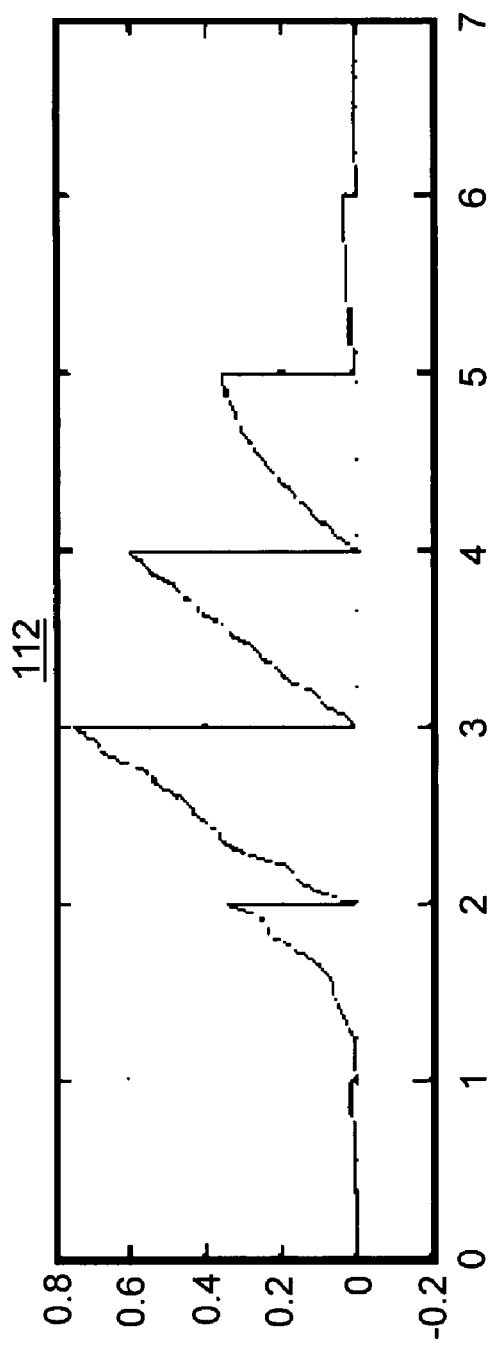
FIG. 3d depicts an exemplary integrated bandpass filtered analog data signal, where the integrator is reset upon being sampled.
Figure 3E:
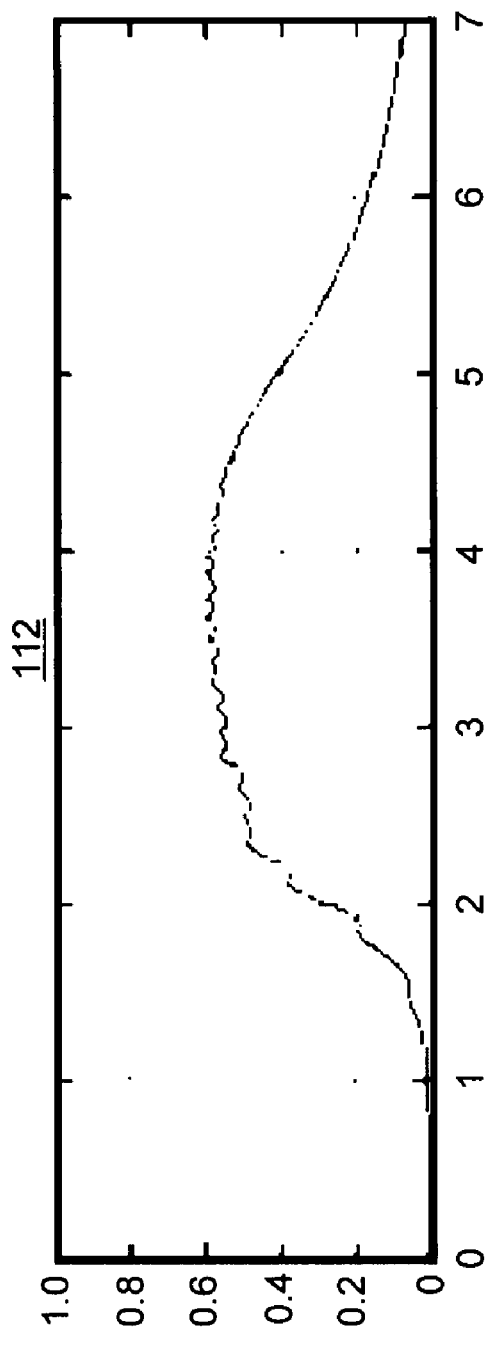
FIG. 3e depicts another exemplary integrated bandpass filtered analog data signal, where the integrator is an exemplary leaky integrator.

FIG. 2a depicts a first analog data compression subsystem 200 used in accordance with a first embodiment of the improved HMS of present invention. Referring to FIG. 2a, the analog data compression subsystem 200 includes bandpass frequency filtering device (or bandpass) 202. The input of the analog filtering device 202 is the result of the conditioning of a raw analog data signal. FIG. 3a depicts an exemplary analog data signal 104 having an increasing frequency, which can be conditioned, as previously described, to produce a conditioned analog data signal 108. The bandpass frequency filtering device 202 receives a conditioned analog data signal 108 and outputs bandpass filtered analog data signal 204 into signal rectifying device (or rectifier) 206. FIG. 3b depicts an exemplary bandpass filtered analog data signal 204. The signal rectifying device 206 rectifies the bandpass filtered analog data signal 204 to produce rectified bandpass filtered analog data signal 208. FIG. 3c depicts an exemplary rectified bandpass filtered analog data signal 208, which is inputted into integrator device (or integrator) 210 to produce an integrated bandpass filtered analog data signal 212. FIG. 3d depicts an exemplary integrated bandpass filtered analog data signal 212, where the integrator 210 is reset upon being sampled. FIG. 3e depicts another exemplary integrated bandpass filtered analog data signal 212, where the integrator 210 is an exemplary leaky integrator. The integrated bandpass filtered analog data signal 212 is applied to analog-to-digital converter circuit 110. Exemplary bandpass frequency filtering device 202 comprises a Butterworth bandpass filter or any other bandpass filter topology. Alternatively, bandpass frequency filtering device 202 may comprise a combination of a low pass filter and a high pass filter that together function as a bandpass filter. Exemplary signal rectifying device 206 comprises a full-wave or a half-wave rectifier. Exemplary integrator device 210 comprises a leaky integrator or an integrator that is reset after being sampled by the analog-to-digital converter circuit 110. Although not shown or described in relation to FIG. 2a or in relation to other figures which follow, one skilled in the art will recognize that under certain circumstances an analog data signal 104 can be directly input into bandpass frequency filtering device 202 without requiring conditioning. Furthermore, conditioning circuitry such as an operational amplifier can optionally be placed after the bandpass frequency filtering device 202, after the signal rectifying device 206, and/or after the integrator device of the analog data compression subsystem 200, as appropriate.

Figure 2B:
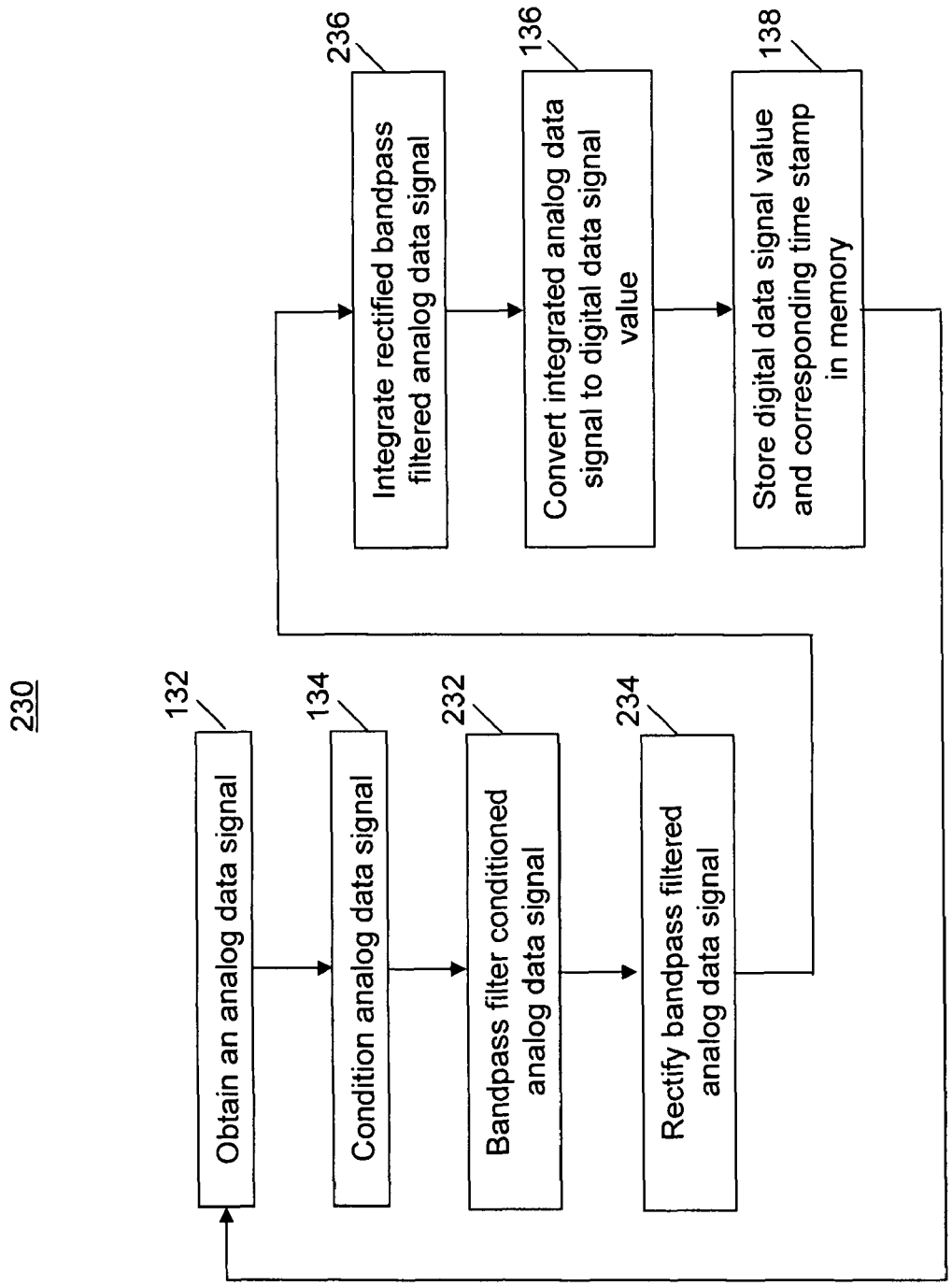

FIG. 2b depicts a data flow diagram 230 corresponding to the first analog data compression subsystem 200 depicted in FIG. 2a. Referring to FIG. 2b, data flow diagram 230 is fundamentally different from prior art method 130 in that it pertains to an integrated bandpass filtered analog data signal corresponding to energy within a frequency band-of-interest. In a first step 132, an analog data signal is obtained, for example, from a sensor. In a second step 134, the analog data signal is conditioned, for example amplified, thereby producing a conditioned analog data signal. The conditioned analog data signal is then bandpass filtered in a third step 232 producing bandpass filtered analog data signal that in a fourth step 234 is rectified. In a fifth step 236, rectified bandpass filtered analog data signal is integrated. Thereafter, method 230 is similar to method 130 in that the integrated bandpass filtered analog data signal is converted to a digital data value in a sixth step 136, except the digital data value corresponds to an integration sample, which corresponds to multiple samples of the analog data signal over a period of time. In a seventh step 138, the digital data value is stored in a memory, for example, a hard drive. A time stamp may be stored along with each digital data value or a stored reference time may be associated with multiple integration sample values, for example, multiple integration samples sampled at a defined sampling rate relative to a determined reference time.

Figure 4A:
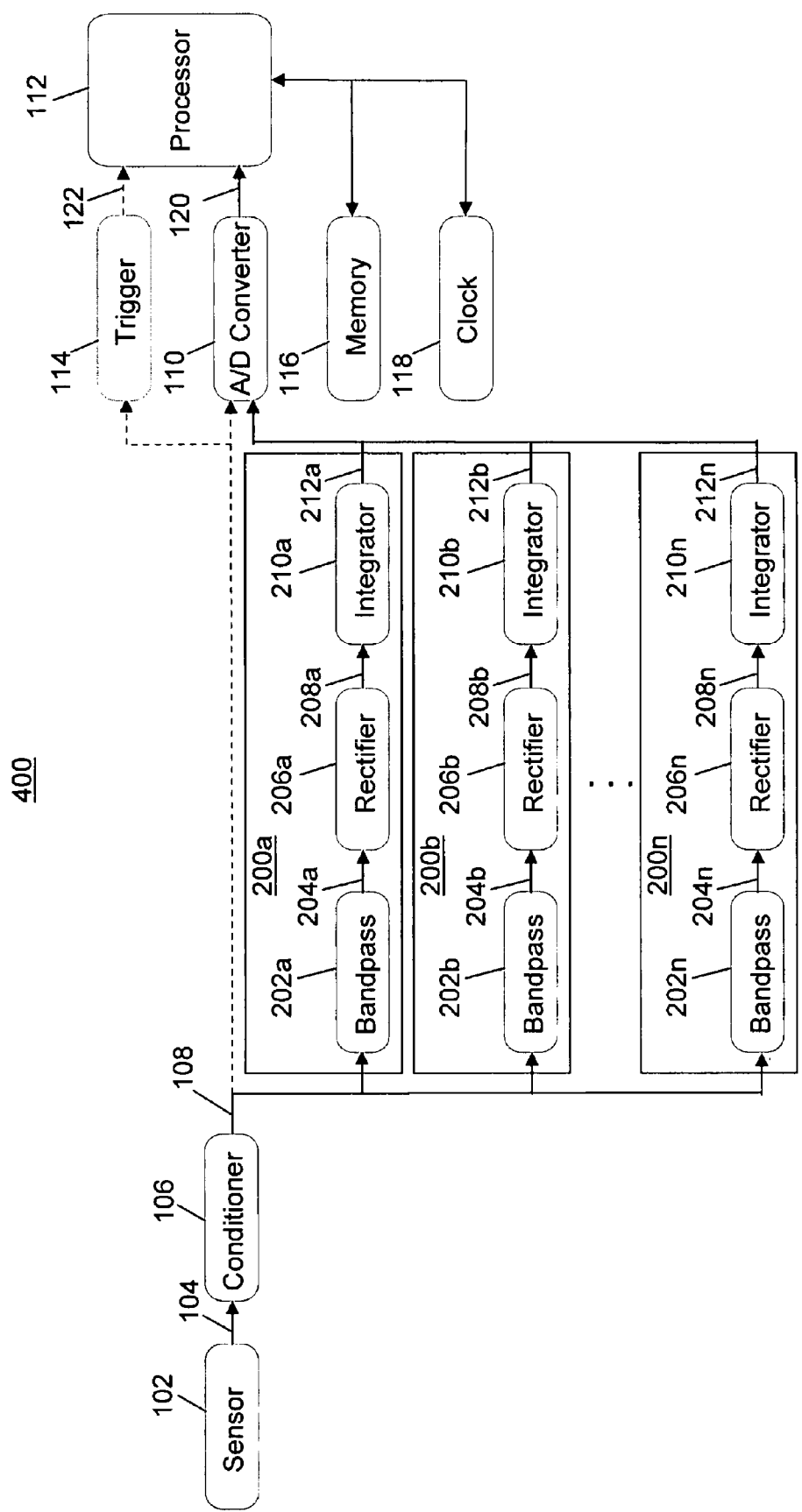
FIG. 4a depicts a first embodiment of the improved health monitoring system in accordance with the present invention.

FIG. 4a depicts a first embodiment of an improved health monitoring system 400 in accordance with the present invention. Referring to FIG. 4a, analog data compression subsystems 200a through 200n are placed in parallel between signal conditioning circuit 106 and analog-to-digital converter circuit 110. As such, each of analog data compression subsystems 200a through 200n receive conditioned analog data signal 108 and produce respective integrated bandpass filtered analog data signals 212a through 212n, which typically would respond to different frequency bands-of-interest as determined by bandpass frequency filtering devices 202a through 202n. Integrated bandpass filtered analog data signals 212a through 212n are converted by analog-to-digital converter circuit 110 into digital data signals 120a through 120n that are provided to processor 112 for subsequent storage and processing. Because the digital data signals 120a through 120n provided to processor 112 have been compressed via bandpass filtering and integration in the analog domain by a respective analog data compression subsystem 200, the amount of data provided to processor 112 is substantially less than would have been provided without the use of the analog data compression subsystem 200. Although only one analog-to-digital converter circuit 110 is shown in FIG. 4a (and in other figures) receiving multiple signals, one skilled in the art will recognize that a plurality of analog-todigital converter circuits 110 can be used to practice the present invention whenever multiple signals are involved. Similarly, a plurality of processors 112, memories 116, and/or clocks 118 can be employed to practice the present invention.

FIG. 4a also shows optional direct connectivity of signal conditioning circuit 106 to analog-to-digital converter circuit 110 and optional direct connectivity of signal conditioning circuit 106 to optional raw analog data trigger device 114. Under one arrangement, when a threshold value has been determined to have been met or exceeded by the raw analog data trigger device 114, raw analog data trigger device 114 triggers a raw analog data event signal 122 to processor 112, which causes analog-to-digital converter circuit 110 to sample conditioned analog data signal 108 at a high sampling rate for some period of time so as to more precisely capture the aftermath of the triggered event.

Figure 4B:
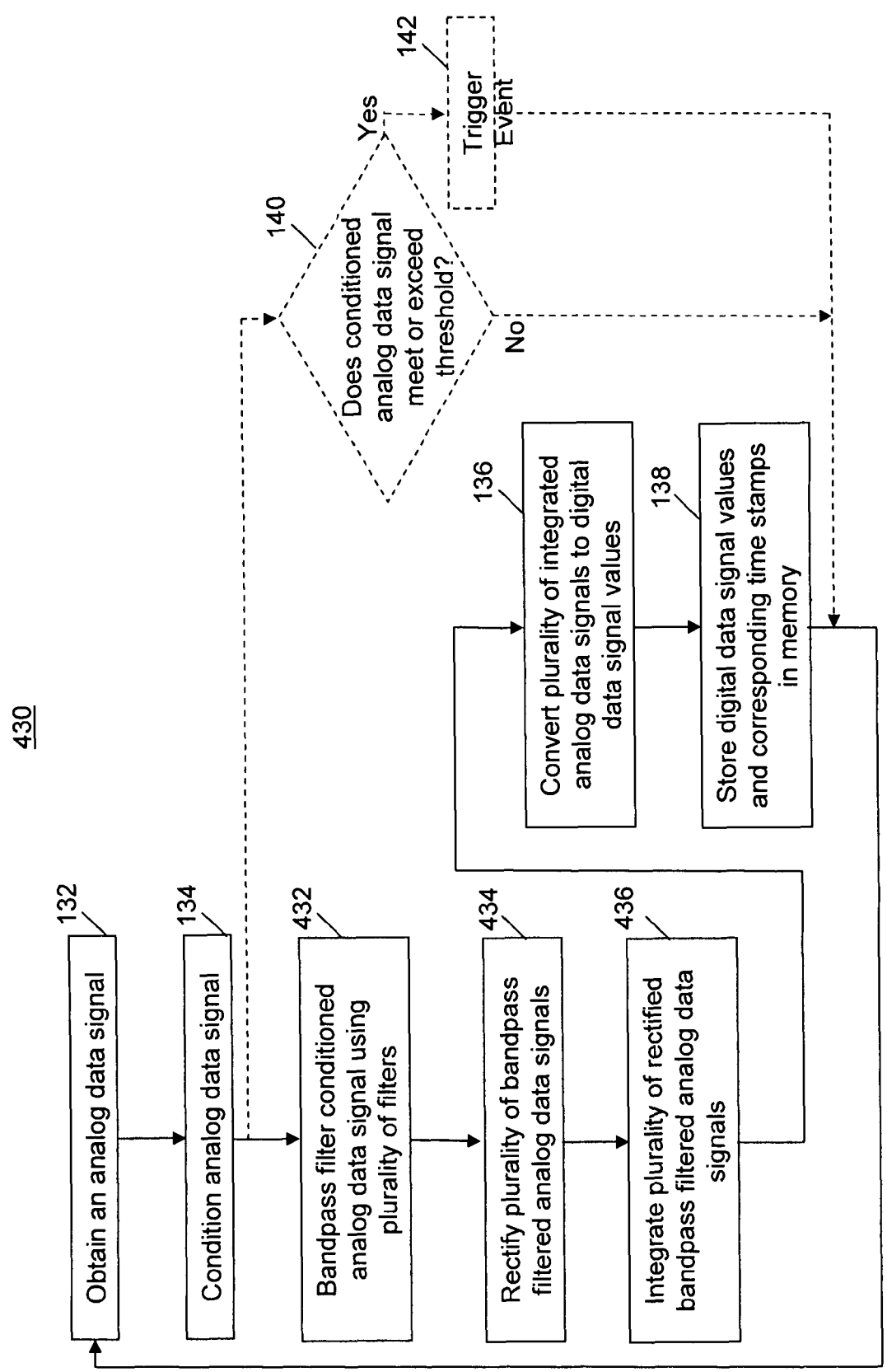
FIG. 4b depicts a first embodiment of an improved health monitoring method in accordance with the present invention.

FIG. 4b depicts a first embodiment of an improved health monitoring method 430 in accordance with the present invention. Referring to FIG. 4b, method 430 is fundamentally different from prior art method 130 in that it pertains to a plurality of integrated bandpass filtered analog data signals corresponding to energies within a plurality of frequency bands-of-interest. In a first step 132, an analog data signal is obtained, for example, from a sensor. In a second step 134, the analog data signal is conditioned, for example amplified, thereby producing a conditioned analog data signal. The conditioned analog data signal is then bandpass filtered by a plurality of frequency filters in a third step 432 producing a plurality of bandpass filtered analog data signals that in a fourth step 434 are rectified to produce a plurality of rectified bandpass filtered analog data signals. In a fifth step 436, the plurality of rectified bandpass filtered analog data signals are integrated to produce a plurality of integrated bandpass filtered analog data signals. Thereafter, method 430 is similar to method 130 in that the plurality of integrated bandpass filtered analog data signals are converted to a plurality of digital data signal values in a sixth step 136 except each of the plurality of digital data signal values corresponds to an integration sample, which corresponds to multiple samples of the analog data signal over a period of time. In seventh step 138, the plurality of digital data signal values are stored in a memory, for example, a hard drive. A time stamp may be stored along with each digital data value or a reference time may be associated with multiple integration sample values, for example, multiple integration samples sampled at a defined sampling rate relative to a determined reference time. An optional step 140 of method 430 is to compare the conditioned analog data signal to a threshold and, if it meets (or exceeds) the threshold, another optional step 142 is performed, which is to trigger an event. Triggering an event could be setting off an alarm, shutting down a system, varying a parameter of the system, changing the rate at which the analog data signal is being sampled, for example, increasing the sampling rate for some period of time in order to more precisely capture the aftermath of the triggered event in greater detail, or any other defined action.

Figure 1A:
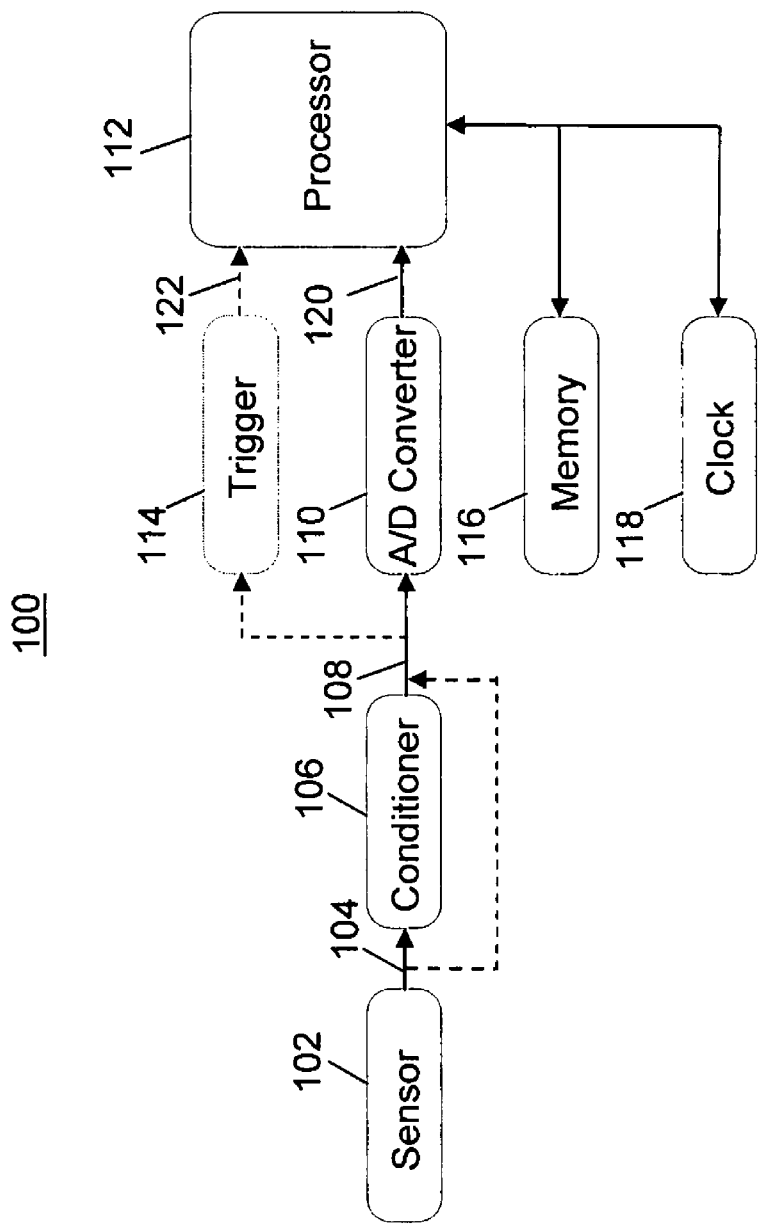
FIG. 1a illustrates an exemplary prior art health monitoring system.
Figure 1B:
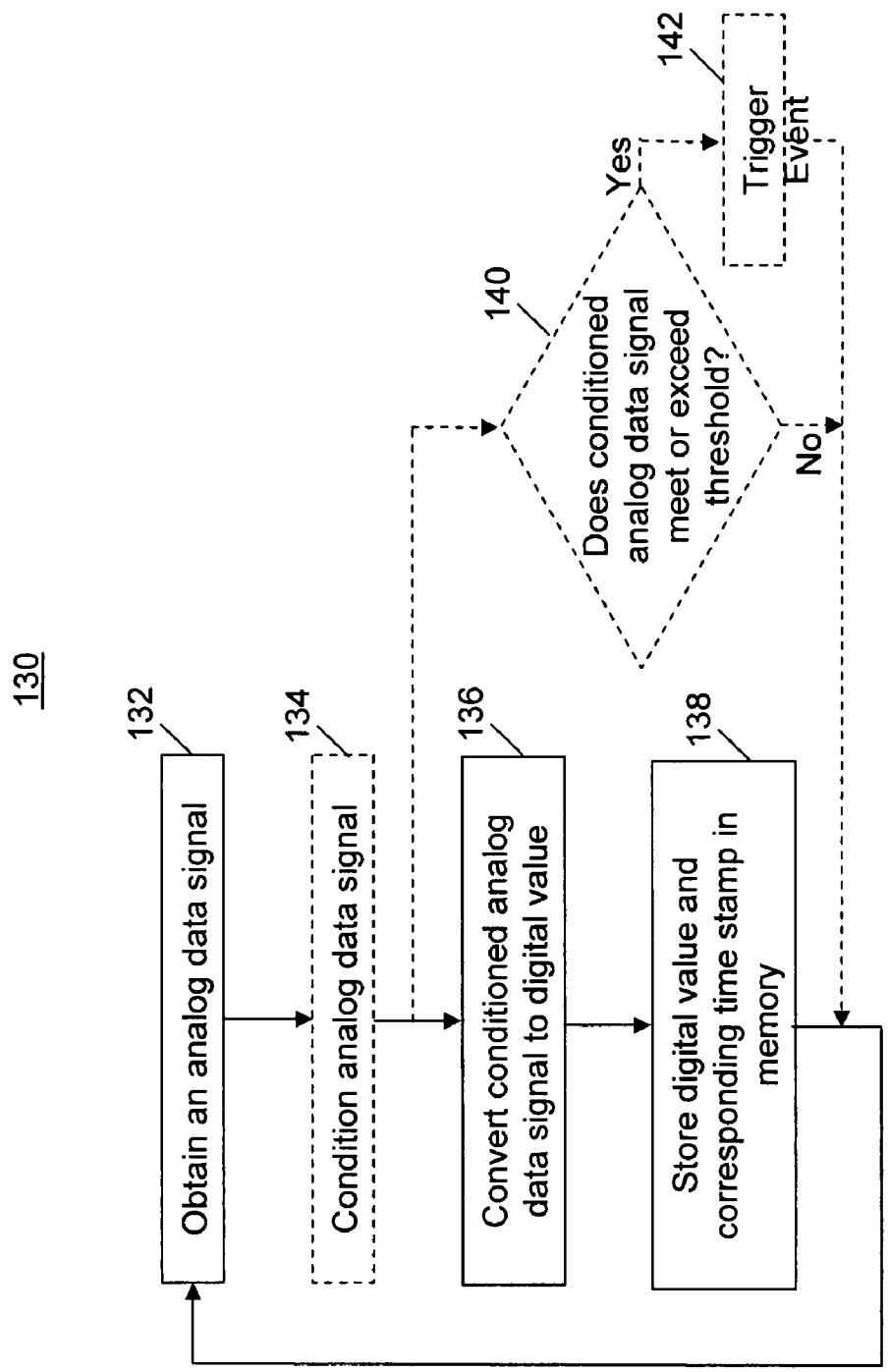
FIG. 1b illustrates an exemplary prior art health monitoring method.
Figure 5A:
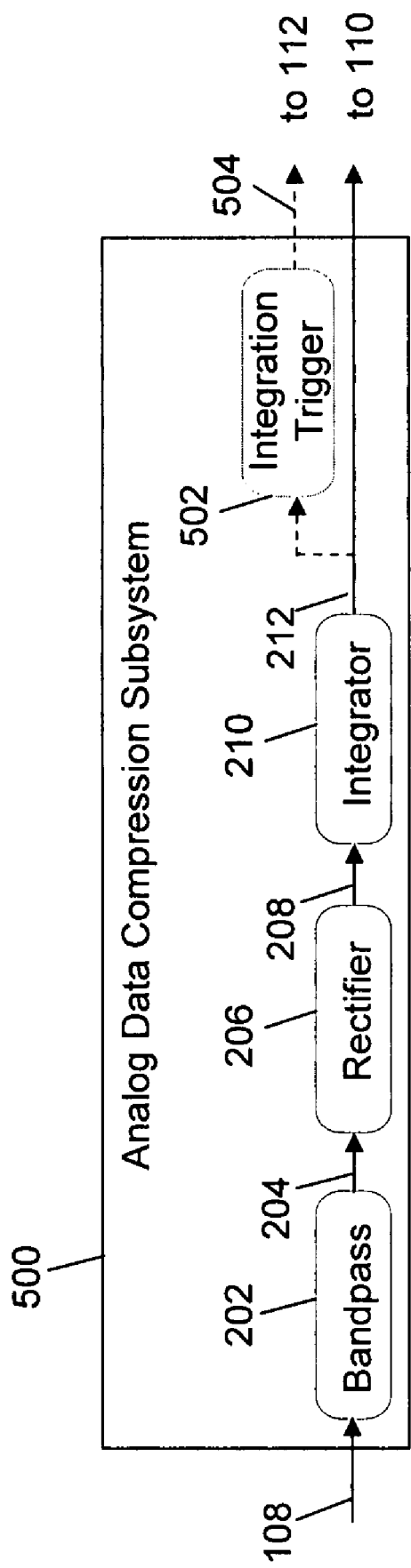
FIG. 5a depicts a second analog data compression subsystem used in accordance with a second embodiment of the present invention.

FIG. 5a depicts a second analog data compression subsystem 500 used in accordance with a second embodiment of the present invention. Referring to FIG. 5a, analog data compression subsystem 500 is the same as analog data compression subsystem 200 except integrator device 210 may also output integrated bandpass filtered analog data signal 212 to optional integrated analog data trigger device (or integration trigger) 502 that compares integrated bandpass filtered analog data signal 212 to a determined threshold value and triggers an integrated analog data event signal 504 to processor 112 when the integrated bandpass filtered analog data signal 212 is greater than or equal to the threshold value. As such, when used as part of analog data compression subsystem 500 the optional integrated analog data trigger device 502 responds to sensor measurements as integrated over time as opposed to responding to an instantaneous sensor measurement signal as is the case with raw analog data trigger device 114 of FIG. 1a. As with raw analog data trigger device 114, integrated analog data trigger device 502 would typically comprise a comparator. However, one skilled in the art will recognized that integrated analog data trigger device 502 could be configured to determine whether integrated bandpass filtered analog data signal 212 is below a threshold, within one or more acceptable ranges, or otherwise meets one or more criteria.

Figure 5B:
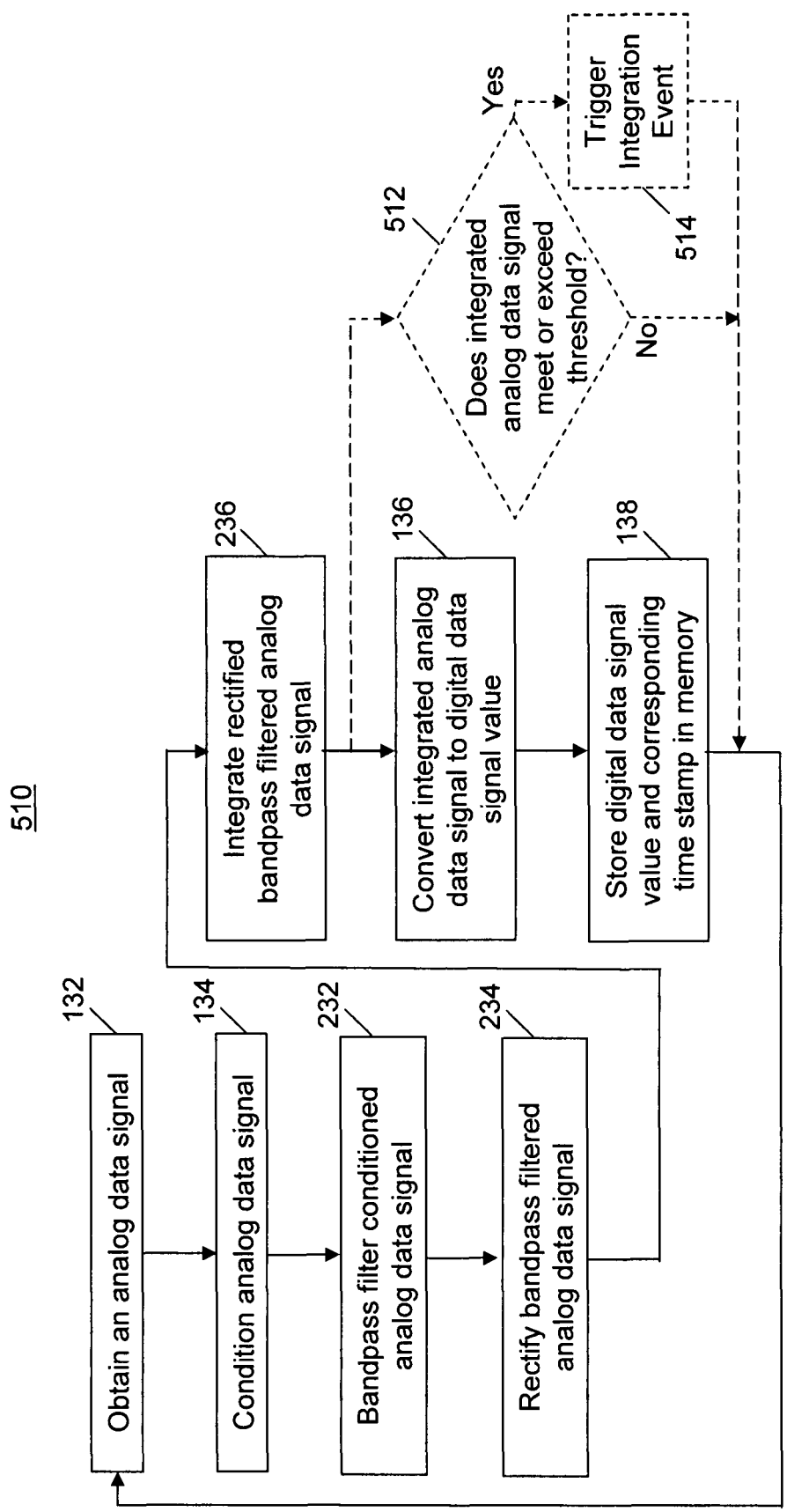

FIG. 5b depicts a data flow diagram 510 corresponding to the second analog data compression system 500 depicted in FIG. 5a. Referring to FIG. 5b, data flow diagram 510 is the same as data flow diagram 230 except it includes an optional step 512 which is to compare the integrated bandpass filtered analog data signal to a threshold and, if it meets (or exceeds) the threshold, another optional step 514 is performed, which is to trigger an integrated analog data event (or integration event). Triggering an integration event could be setting off an alarm, shutting down a system, varying a parameter of the system, changing the rate at which the analog data signal is being sampled, for example, increasing the sampling rate for some period of time in order to more precisely capture the aftermath of the triggered integrated analog data event in greater detail, or any other defined action or process. Generally, an integration event is similar to the event described in relation to FIG. 1a except that an integration event relates to integrated bandpass filtered analog data instead of a raw analog data measurement (or raw data sample). As such, various types of warning and other reactionary systems can be employed to provide any of various types of warnings, to perform a desired action, and/or execute a desired function or process based on a triggered raw analog data event and/or a triggered integrated analog data event.

Figure 5C:
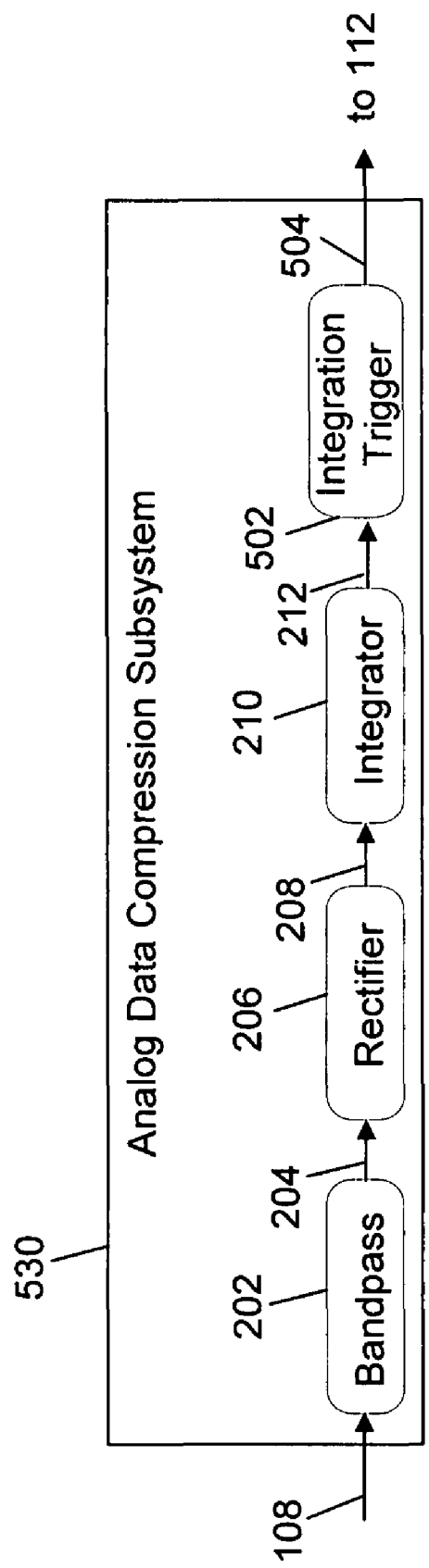
FIG. 5c depicts a third analog data compression subsystem used in accordance with a third embodiment of the present invention.

FIG. 5c depicts a third analog data compression subsystem 530 used in accordance with a third embodiment of the present invention. Referring to FIG. 5c, analog data compression subsystem 530 is similar to analog data compression subsystem 500 except that it only outputs integrated bandpass filtered analog data signal 212 to integrated analog data trigger device 502 that compares integrated bandpass filtered analog data signal 212 to a determined threshold value and triggers an integrated analog data event signal 504 to processor 112 when the integrated bandpass filtered analog data signal 212 is greater than or equal to the threshold value (or otherwise meets one or more criteria). With this embodiment, the integrated bandpass filtered analog data signal 212 is not converted to a digital value for storage in a memory.

Figure 5D:
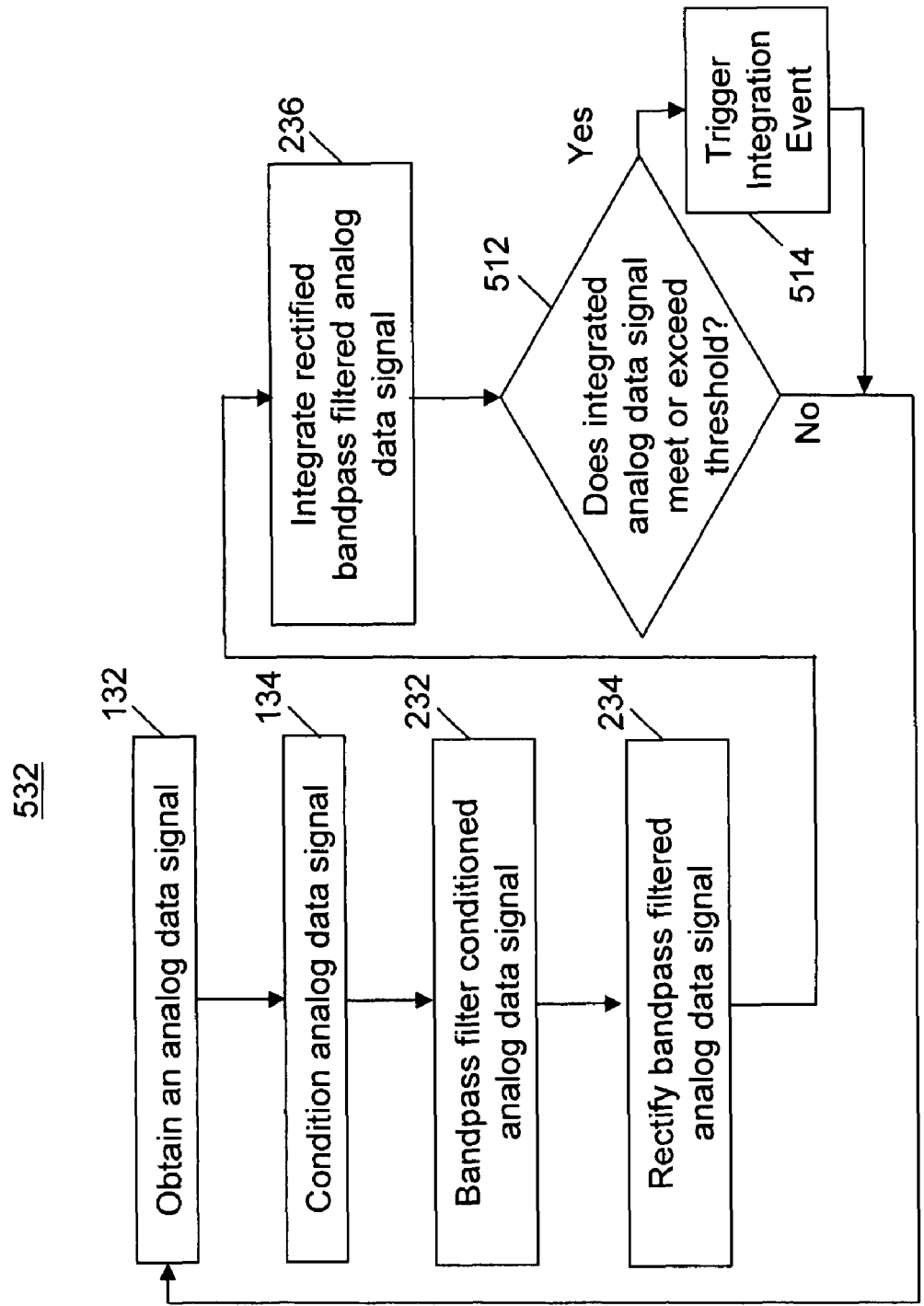
FIG. 5d depicts a data flow diagram corresponding to the third analog data compression subsystem depicted in FIG. 5c.

FIG. 5d depicts a data flow diagram 532 corresponding to the third analog data compression system 530 depicted in FIG. 5c. Referring to FIG. 5d, data flow diagram 532 is similar to data flow diagram 510 except that the steps of converting the integrated bandpass filtered analog data signal to a digital data signal value and storing in memory are removed and the steps of comparing the integrated bandpass filtered analog data signal to a threshold 512 and the step 514 of triggering an integration event if it meets or exceeds the threshold (or otherwise meets one or more criteria) are not optional.

Figure 5E:
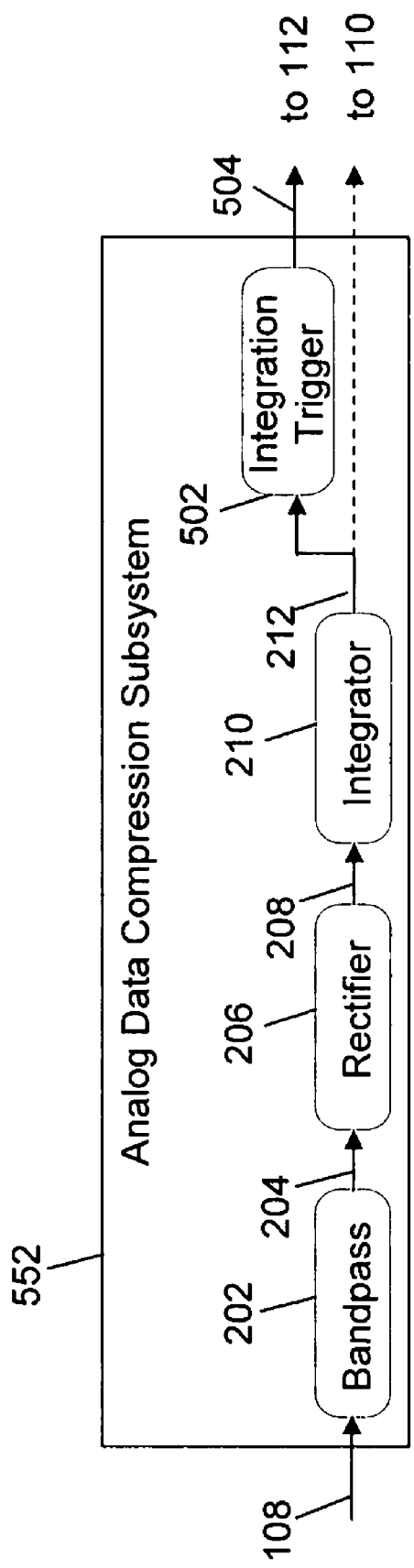
FIG. 5e depicts a fourth analog data compression subsystem used in accordance with a fourth embodiment of the present invention.

FIG. 5e depicts a fourth analog data compression subsystem 552 used in accordance with a fourth embodiment of the present invention. Referring to FIG. 5e, analog data compression subsystem 552 is similar to analog data compression subsystem 530 except that integrated bandpass filtered analog data signal 212 can be optionally output to an analog-to-digital converter 110 for subsequent storage in memory 116.

Figure 5F:
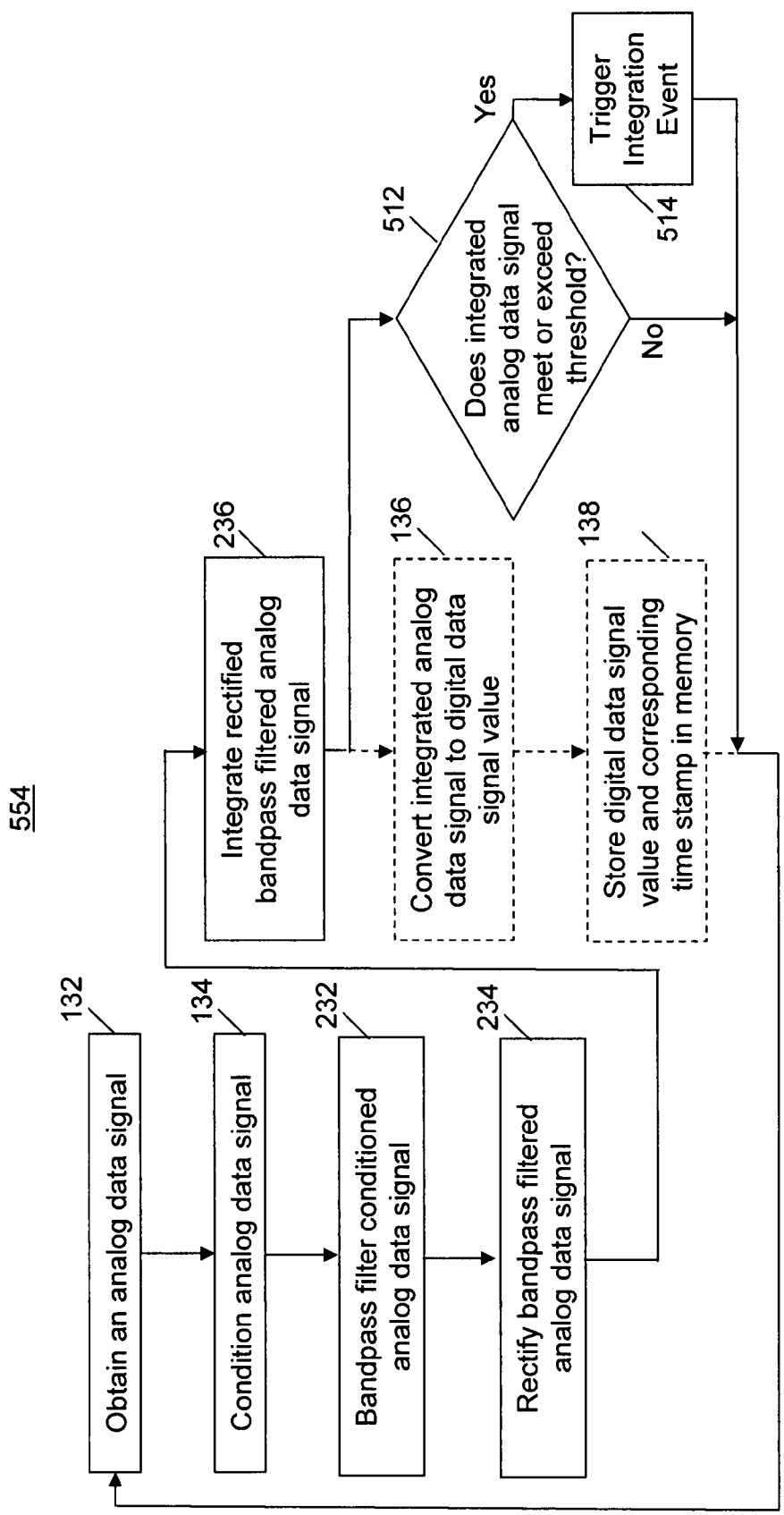
FIG. 5f depicts a data flow diagram corresponding to the fourth analog data compression subsystem depicted in FIG. 5e.

FIG. 5f depicts a data flow diagram 554 corresponding to the fourth analog data compression system 552 depicted in FIG. 5e. Referring to FIG. 5f, data flow diagram 554 is similar to data flow diagram 532 except that it includes optional steps 136, 138 where the integrated bandpass filtered analog data signal is converted to a digital data value and the digital data value is stored in a memory.

Figure 5G:
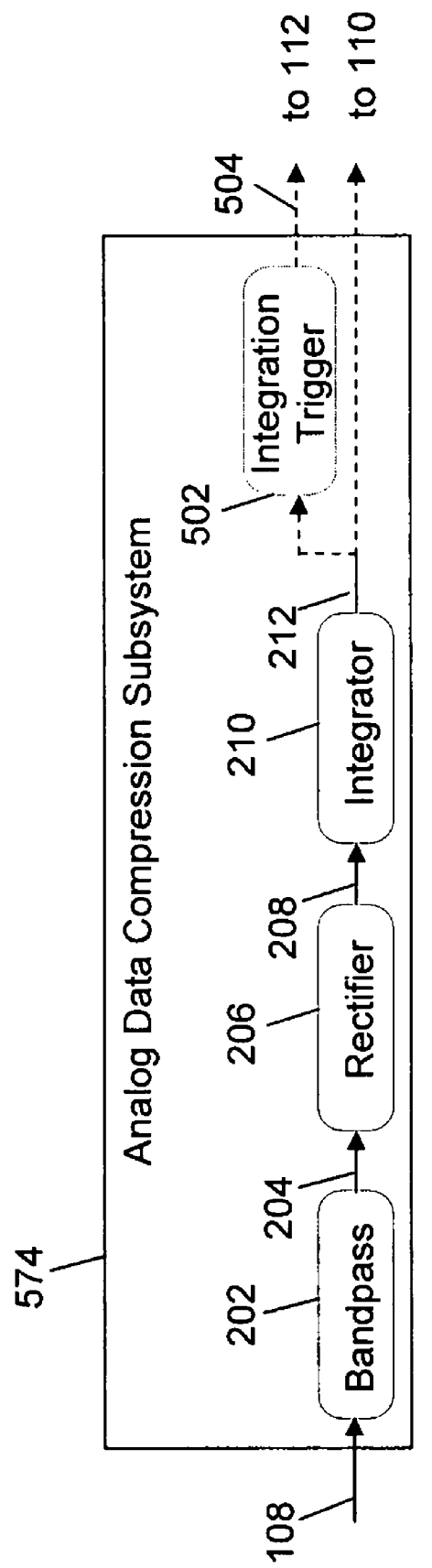
FIG. 5g depicts a fifth analog data compression subsystem used in accordance with a fifth embodiment of the present invention.

FIG. 5g depicts a fifth analog data compression subsystem 574 used in accordance with a fifth embodiment of the present invention. Referring to FIG. 5g, analog data compression subsystem 574 is similar to analog data compression subsystem 552 except that the integrated bandpass filtered analog data signal 212 can be optionally output to integrated analog data trigger device 502 and can be optionally output to an analog-to-digital converter 110 for subsequent storage in memory 116.

Figure 5H:
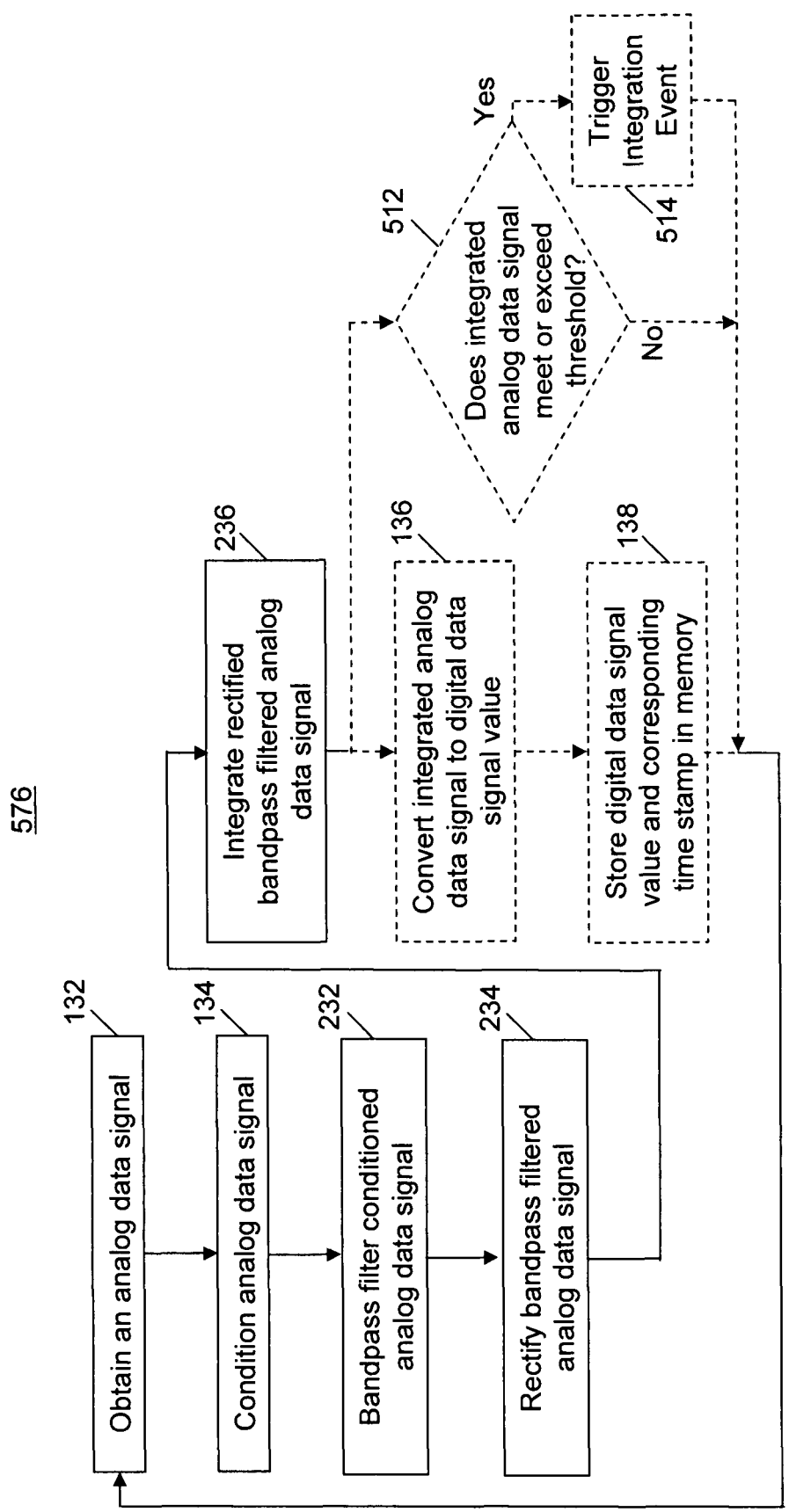
FIG. 5h depicts a data flow diagram corresponding to the fifth analog data compression subsystem depicted in FIG. 5g.

FIG. 5h depicts a data flow diagram 576 corresponding to the fifth analog data compression subsystem 574 depicted in FIG. 5g. Referring to FIG. 5h, data flow diagram 576 is similar to data flow diagram 554 except the steps 512, 514 of comparing the integrated bandpass filtered analog data signal to a threshold and, if it meets (or exceeds) the threshold, triggering an integration event are optional.

Figure 5I:
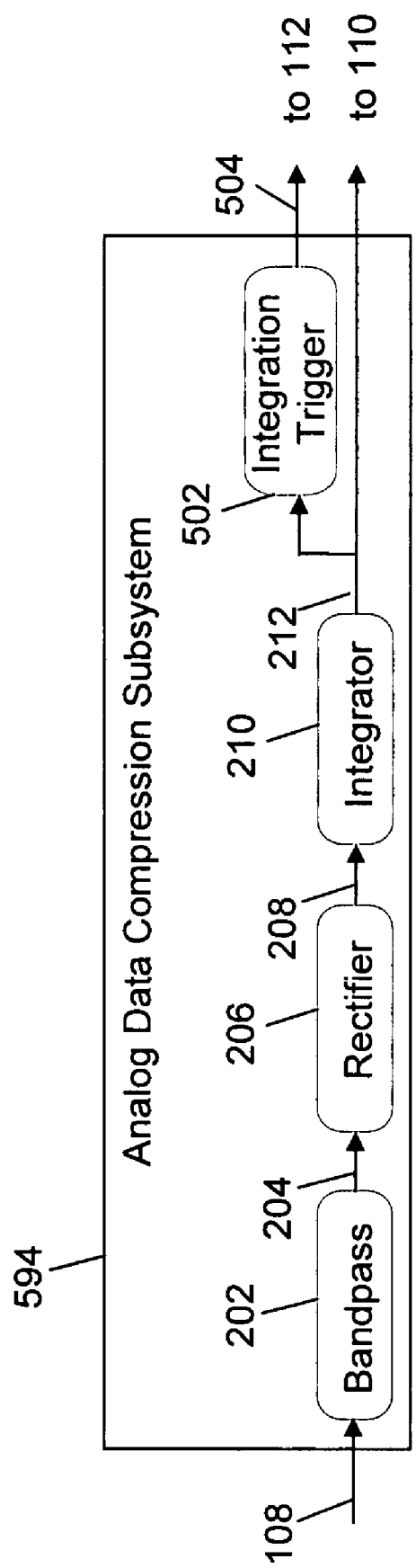
FIG. 5i depicts a sixth analog data compression subsystem used in accordance with a sixth embodiment of the present invention.

FIG. 5i depicts a sixth analog data compression subsystem 594 used in accordance with a sixth embodiment of the present invention. Referring to FIG. 5i, analog data compression subsystem 594 is similar to analog data compression subsystem 574 except that the integrated bandpass filtered analog data signal 212 is always output to integrated analog data trigger device 502 and to analog-to-digital converter 110 for subsequent storage in memory 116.

Figure 5J:
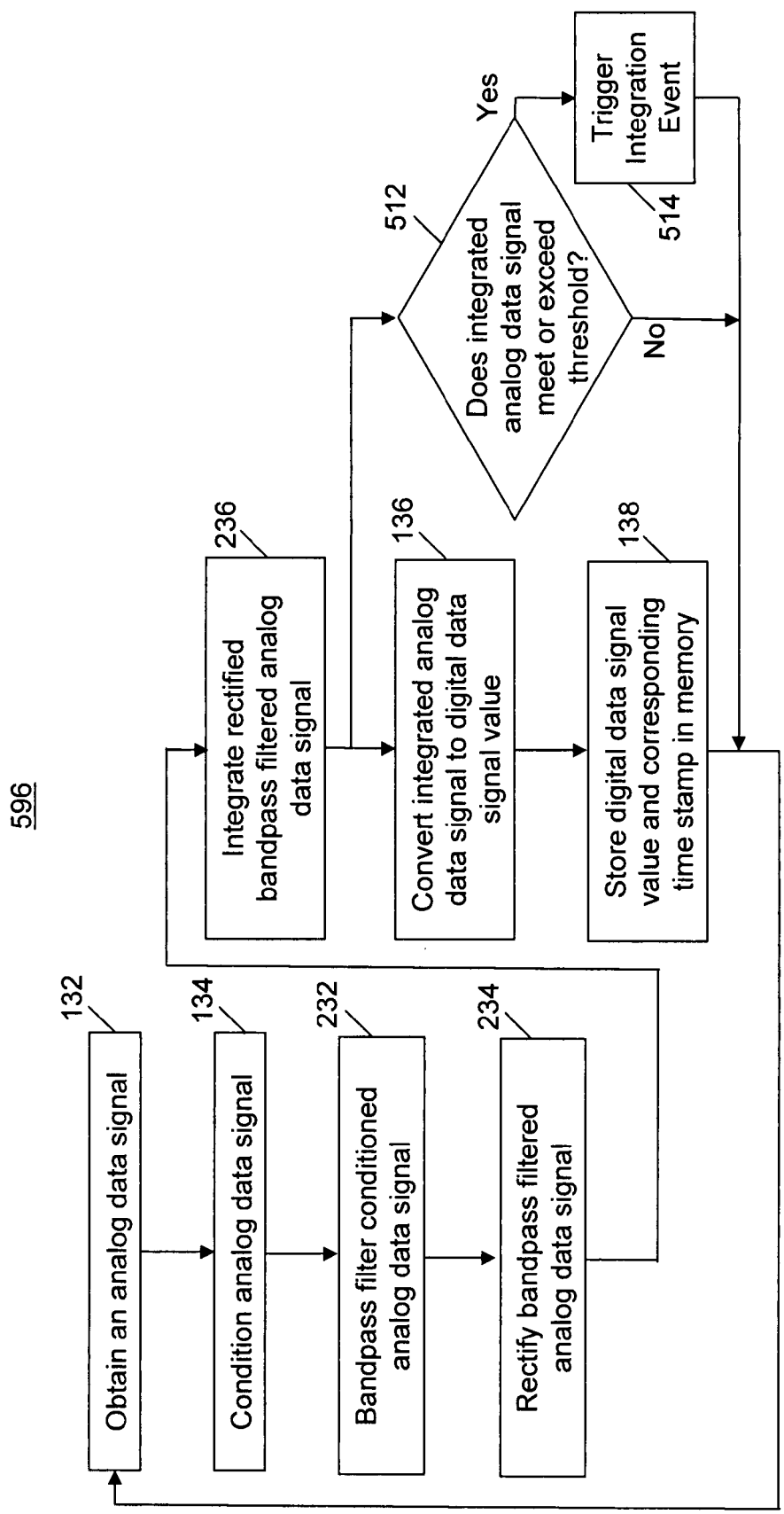
FIG. 5j depicts a data flow diagram corresponding to the sixth analog data compression subsystem depicted in FIG. 5i.

FIG. 5j depicts a data flow diagram 596 corresponding to the sixth analog data compression system 594 depicted in FIG. 5i. Referring to FIG. 5j, data flow diagram 596 is similar to data flow diagram 576 except the steps 512, 514 of comparing the integrated bandpass filtered analog data signal to a threshold and triggering an integration event if it meets or exceeds the threshold (or otherwise meets one or more criteria), and the steps of outputting to an analog-to-digital converter 136 for subsequent storage in memory 138 are not optional.

Figure 6A:
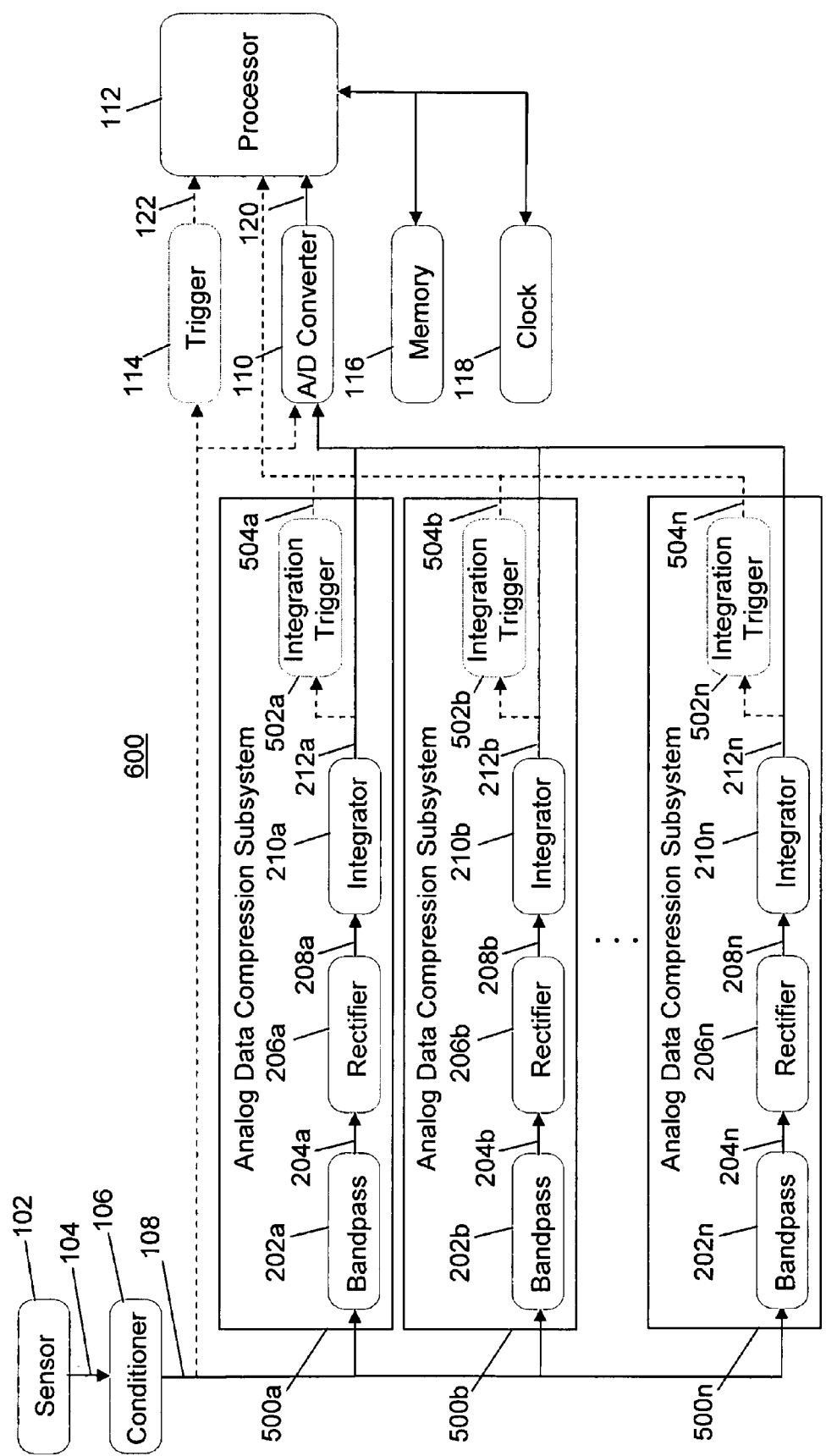
FIG. 6a depicts a second embodiment of the improved health monitoring system in accordance with the present invention.

FIG. 6a depicts a second embodiment of an improved health monitoring system 600 in accordance with the present invention. Referring to FIG. 6a, analog data compression subsystems 500a through 500n are placed in parallel between signal conditioning circuit 106 and analog-to-digital converter circuit 110. As such, each of analog data compression subsystems 500a through 500n receive conditioned analog data signal 108 and produce respective integrated bandpass filtered analog data signals 212a through 212n, which typically would respond to different frequency bands-of-interest as determined by bandpass frequency filtering devices 202a through 202n. Integrated bandpass filtered analog data signals 212a through 212n are converted by analog-to-digital converter circuit 110 into a digital data signals 120a through 120n that are provided to processor 112 for subsequent storage and processing. Because the digital data signals 120a through 120n provided to processor 112 have been compressed via bandpass filtering and integration in the analog domain by respective analog data compression subsystems 500a through 500n, the amount of data received by processor 112 is substantially less than would have been provided without the use of the analog data compression subsystems 500a through 500n. Integrator devices 210a through 210n may also output integrated bandpass filtered analog data signals 212a through 212n to optional integrated analog data trigger device 502a through 502n to compare integrated bandpass filtered analog data signals 212a through 212n to respective threshold values so as to trigger respective integrated analog data event signals 504a through 504n to processor 112 when any corresponding one of integrated bandpass filtered analog data signals 212a through 212n is greater than or equal to a respective threshold value (or otherwise meets one or more criteria).

FIG. 6a also shows optional direct connectivity of signal conditioning circuit 106 to analog-to-digital converter circuit 110 and optional direct connectivity of signal conditioning circuit 106 to raw analog data trigger device 114. Under one arrangement, when a threshold value has been determined to have been met or exceeded by the raw analog data trigger device 114, raw analog data trigger device 114 triggers a raw analog data event signal 122 to processor 112, which causes analog-to-digital converter circuit 110 to sample conditioned analog data signal 108 at a high sampling rate for some period of time so as to more precisely capture the aftermath of the triggered raw analog data event. Under another arrangement, when a respective threshold value has been determined to have been met or exceeded by any of the optional integrated analog data trigger devices 502a through 502n, a corresponding integrated analog data event signal 504a through 504n is provided to processor 112, which causes analog-to-digital converter circuit 110 to sample conditioned analog data signal 108 at a high sampling rate for some defined period of time so as to more precisely capture the aftermath of the triggered integrated analog data event.

Figure 6B:
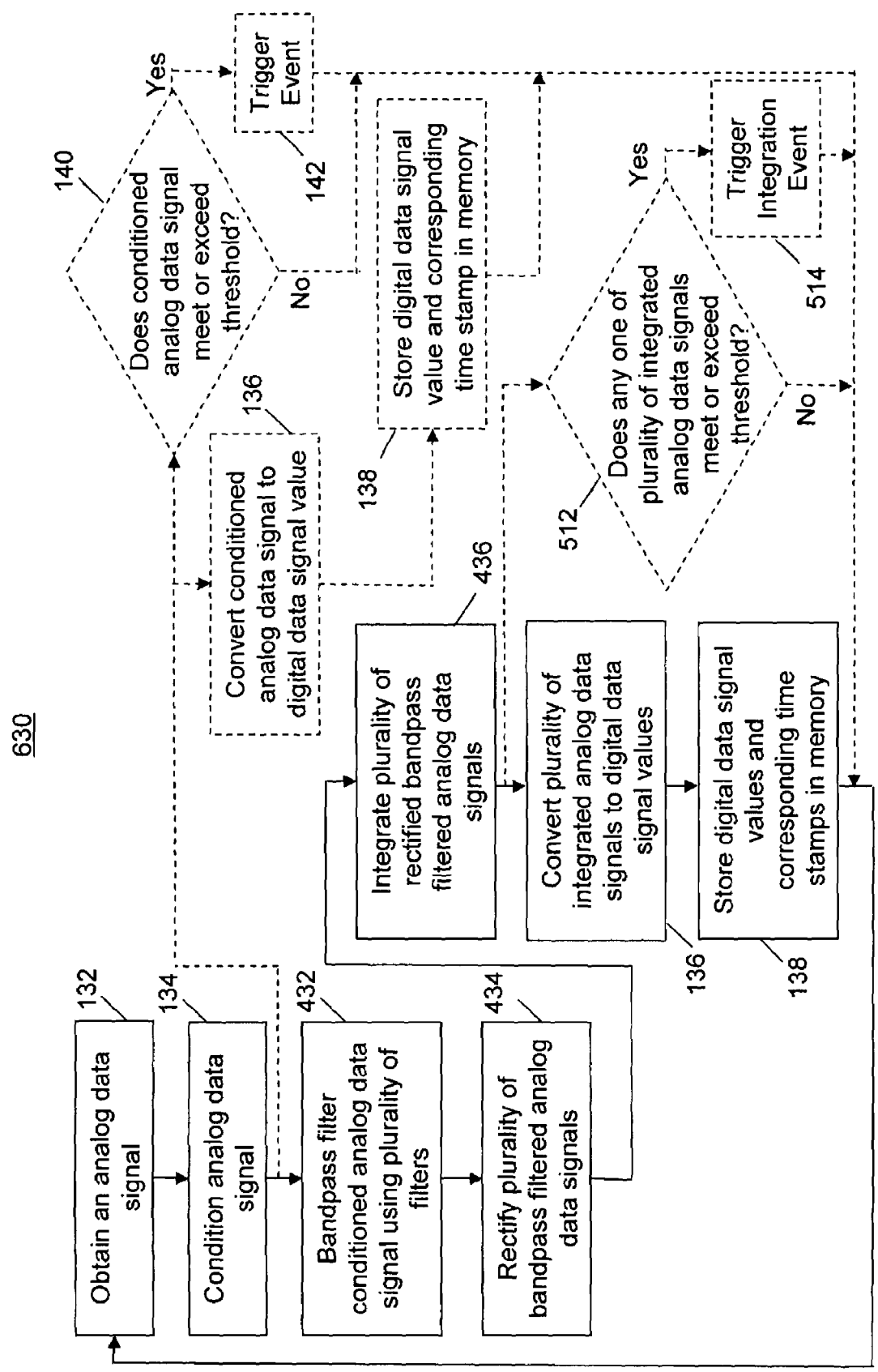
FIG. 6b depicts a second embodiment of an improved health monitoring method in accordance with the present invention.

FIG. 6b depicts a second embodiment of an improved health monitoring method 630 in accordance with the present invention. Referring to FIG. 6b, in a first step 132, an analog data signal is obtained, for example, from a sensor. In a second step 134, the analog data signal is conditioned, for example amplified, thereby producing a conditioned analog data signal. The conditioned analog data signal is then bandpass filtered by a plurality of frequency filters in a third step 432 producing a plurality of bandpass filtered analog data signals that in a fourth step 434 are rectified to produce a plurality of rectified bandpass filtered analog data signals. In a fifth step 436, the plurality of rectified bandpass filtered analog data signal are integrated to produce a plurality of integrated bandpass filtered analog data signals. Thereafter, method 630 is similar to method 130 in that the plurality of integrated bandpass filtered analog data signals are converted to a plurality of digital data signal values in a sixth step 136 except each of the plurality of digital data signal values corresponds to an integration sample, which corresponds to multiple samples of the analog data signal over a period of time. In seventh step 138, the plurality of digital data signal values are stored in a memory, for example, a hard drive. A time stamp may be stored along with each digital data value or a reference time may be associated with multiple integration sample values, for example, multiple integration samples sampled at a defined sampling rate relative to a determined reference time. An optional step 136 of method 630 is to convert the conditioned analog data signal to a digital data value. Step 136 is followed by step 138, where the digital data value is stored in memory. An optional step 140 of method 630 is to compare the conditioned analog data signal to a threshold and, if it meets (or exceeds) the threshold, another optional step 142 is performed, which is to trigger an event. An additional optional step 512 of method 630 is to compare the plurality of integrated bandpass filtered analog data signals to a threshold and, if any one meets or exceeds a threshold (or otherwise meets one or more criteria), another optional step 514 triggers an integration event.

Figure 6C:
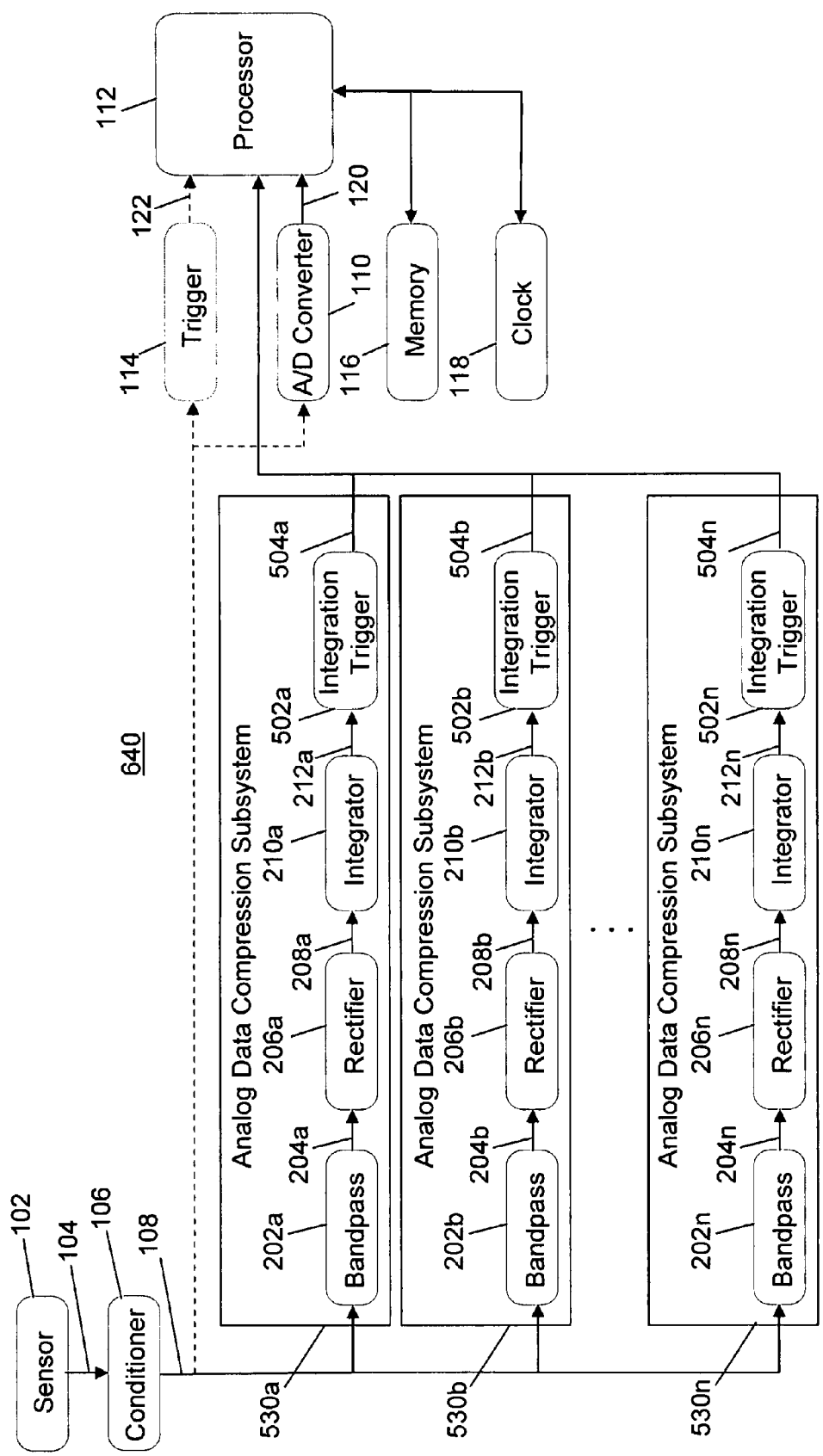
FIG. 6c depicts a third embodiment of an improved health monitoring system in accordance with the present invention.

FIG. 6c depicts a third embodiment of an improved health monitoring system 640 in accordance with the present invention. Referring to FIG. 6c, analog data compression subsystems 530a through 530n are placed in parallel between signal conditioning circuit 106 and analog-to-digital converter circuit 110. As such, each of analog data compression subsystems 530a through 530n receive conditioned analog data signal 108 and produce respective integrated bandpass filtered analog data signals 212a through 212n, which typically would respond to different frequency bands-of-interest as determined by bandpass frequency filtering devices 202a through 202n. Integrator devices 210a through 210n output integrated bandpass filtered analog data signals 212a through 212n to integrated analog data trigger devices 502a through 502n to compare integrated bandpass filtered analog data signals 212a through 212n to respective threshold values so as to trigger respective integrated analog data event signals 504a through 504n to processor 112 when any corresponding one of integrated bandpass filtered analog data signals 212a through 212n is greater than or equal to a respective threshold value (or otherwise meets one or more criteria).

FIG. 6c also shows optional direct connectivity of signal conditioning circuit 106 to analog-to-digital converter circuit 110 and optional direct connectivity of signal conditioning circuit 106 to raw analog data trigger device 114. Under one arrangement, when a respective threshold value has been determined to have been met or exceeded by any of the integrated analog data trigger devices 502a through 502n, a corresponding integrated analog data event signal 504a through 504n is provided to processor 112, which causes analog-to-digital converter circuit 110 to sample conditioned analog data signal 108 at a high sampling rate for some period of time so as to more precisely capture the aftermath of the triggered integrated analog data event. Under another arrangement, optional raw analog data trigger device 114 outputs a raw analog data event signal 122 if conditioned analog data signal 108 exceeds a threshold (or otherwise meets one or more criteria).

Figure 6D:
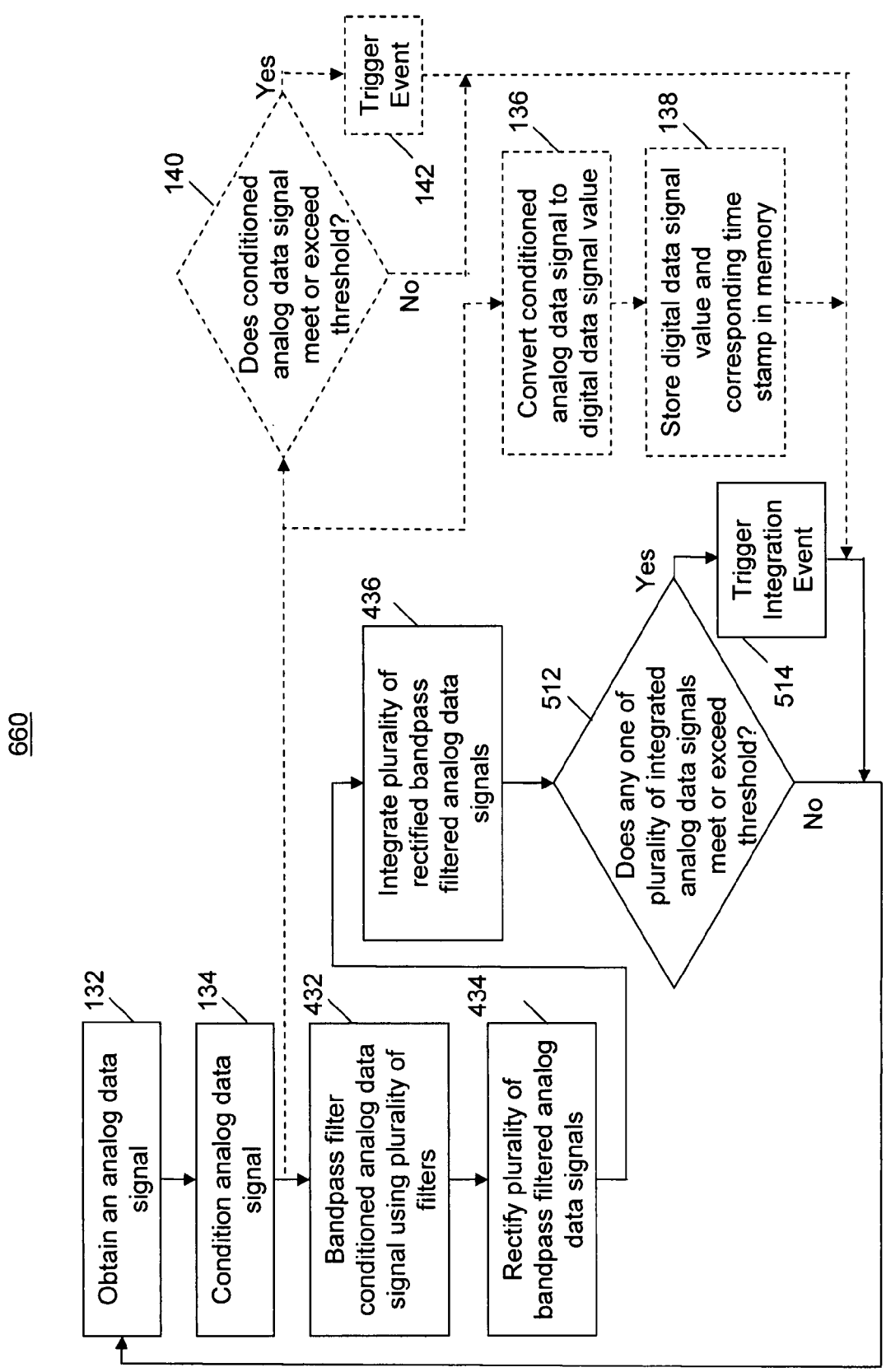
FIG. 6d depicts a third embodiment of an improved health monitoring method in accordance with the present invention.

FIG. 6d depicts a third embodiment of an improved health monitoring method 660 in accordance with the present invention. Referring to FIG. 6d, improved health monitoring method 660 is similar to improved health monitoring method 630 except is does not provides steps for converting the plurality of integrated bandpass filtered analog data signals to digital data signal values 136 and storing the digital data signal values in memory 138 and the steps 512, 514 of comparing the plurality of integrated bandpass filtered analog data signals to a threshold and triggering an integration event if any one meets or exceeds a threshold (or otherwise meets one or more criteria) are not optional.

FIG. 6a can be modified to depict a fourth embodiment of an improved health monitoring system by replacing analog data compression subsystems 500a through 500n with analog data compression subsystems 552a through 552n. With this modification, the integration triggers 502a through 502n and corresponding outputs 504a through 504n are no longer optional, which would be indicated in modified FIG. 6a using solid lines. Furthermore, in accordance with the fourth embodiment, the output of integrated bandpass filtered analog data signals 212a through 212n to analog-to-digital converter 110 is optional, which would be indicated in modified FIG. 6a using dashed lines.

FIG. 6b can be modified to depict a fourth embodiment of an improved health monitoring method corresponding to data flow diagram 554. In accordance with the fourth embodiment, steps 512 and 514 are no longer optional, which would be indicated in modified FIG. 6b using solid lines. Furthermore, in accordance with the fourth embodiment, steps 136 and 138 are optional, which would be indicated in modified FIG. 6b using dashed lines.

FIG. 6a can also be modified to depict a fifth embodiment of an improved health monitoring method by replacing analog data compression subsystems 500a through 500n with analog data compression subsystems 574a through 574n. In accordance with the fifth embodiment, the output of integrated bandpass filtered analog data signals 212a through 212n to analog-to-digital converter 110 is optional, which would be indicated in modified FIG. 6a using dashed lines.

FIG. 6b can also be modified to depict a fifth embodiment of an improved health monitoring method corresponding to data flow diagram 576. In accordance with the fifth embodiment, steps 136 and 138 are optional, which would be indicated in modified FIG. 6b using dashed lines.

FIG. 6a can also be modified to depict a sixth embodiment of an improved health monitoring method by replacing analog data compression subsystems 500a through 500n with analog data compression subsystems 594a through 594n. In accordance with the sixth embodiment, the integration triggers 502a through 502n and corresponding outputs 504a through 504n are no longer optional, which would be indicated in modified FIG. 6b using solid lines.

FIG. 6b can also be modified to depict a sixth embodiment of an improved health monitoring method corresponding to data flow diagram 596. In accordance with the sixth embodiment, steps 512 and 514 are no longer optional, which would be indicated in modified FIG. 6b using solid lines.

Figure 7A:
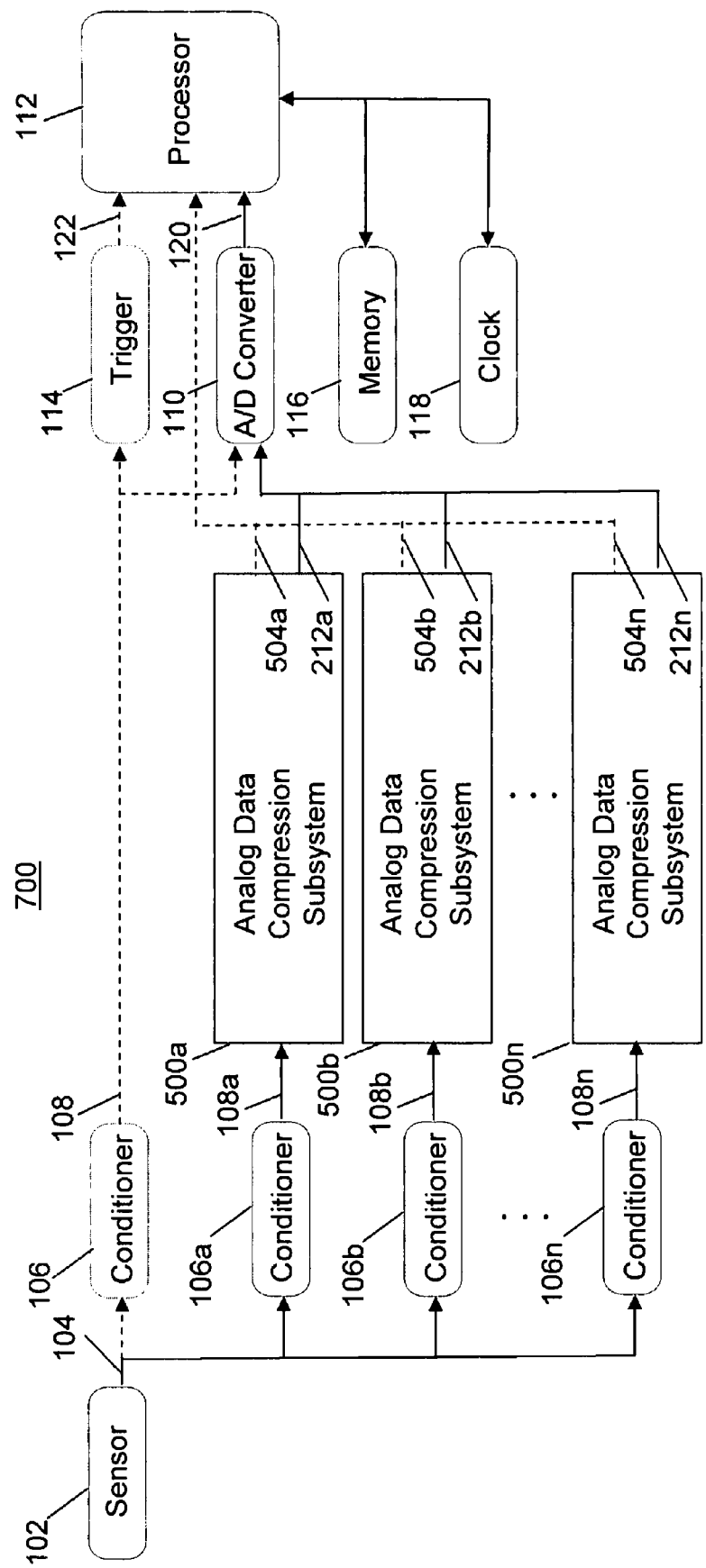
FIG. 7a depicts an alternative embodiment of an improved health monitoring system in accordance with the present invention.

FIG. 7a depicts an alternative embodiment of an improved health monitoring system 700 in accordance with the present invention. Referring to FIG. 7a, improved health monitoring system 700 is much like improved health monitoring system 600 except that analog data signal 104 is conditioned by separate signal conditioning circuits 106a through 106n associated with analog data compression subsystems 500a through 500n. As such, conditioned analog data signals 108a through 108n may differ from each other, as appropriate. For example, conditioned analog data signals 108a through 108n may have received different levels of amplification.

Figure 7B:
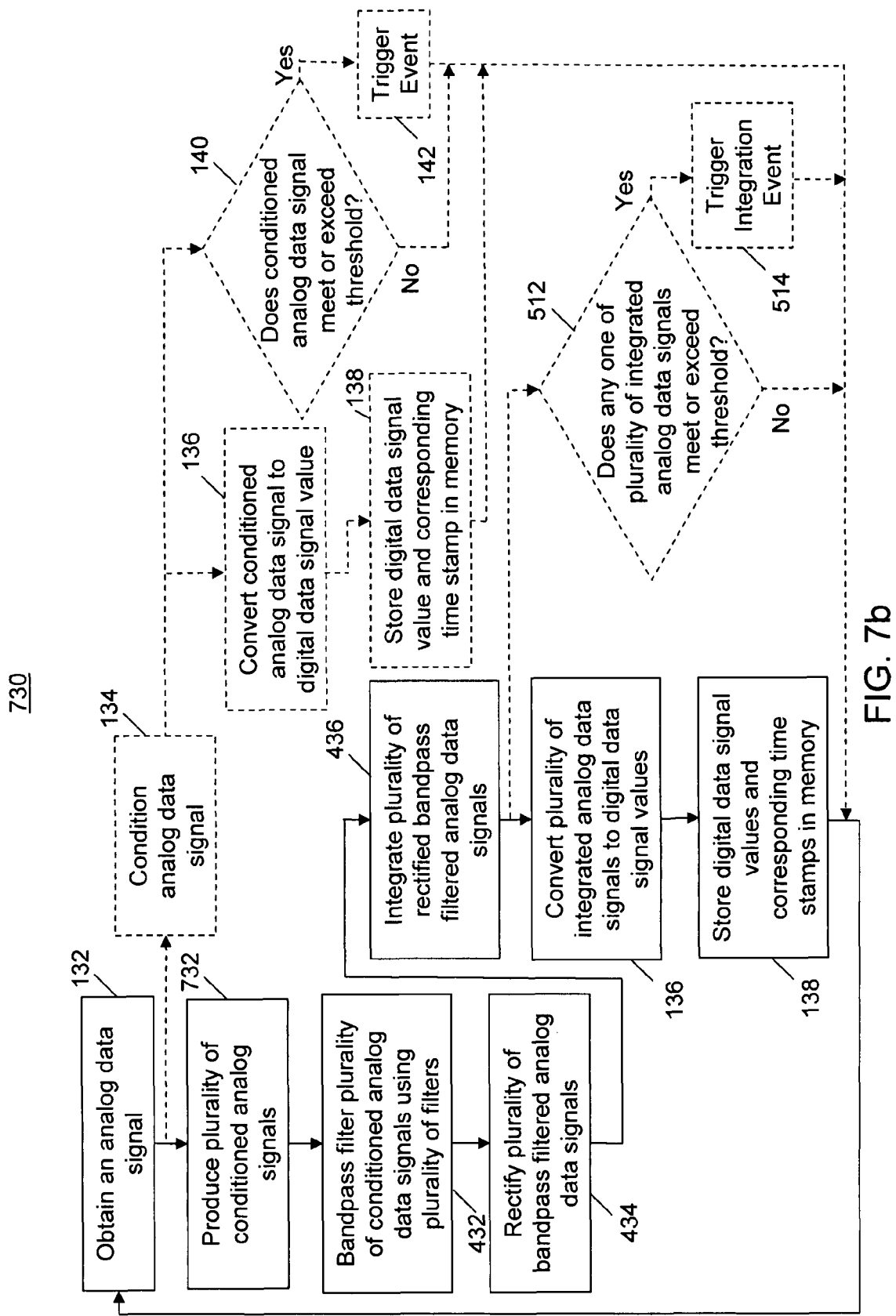
FIG. 7b depicts an alternative embodiment of an improved health monitoring method in accordance with the present invention.

FIG. 7b depicts an alternative embodiment of an improved health monitoring method 730 in accordance with the present invention. Referring to FIG. 7b, improved health monitoring method 730 is similar to improved health monitoring method 630 except it includes the step 732 where a plurality of conditioned analog data signals are produced. The plurality of conditioned analog data signals are then bandpass filtered by a plurality of frequency filters in a third step 432 producing a plurality of bandpass filtered analog data signals. Otherwise, the improved health monitoring method 730 is same as improved health monitoring method 630.

Figure 8A:
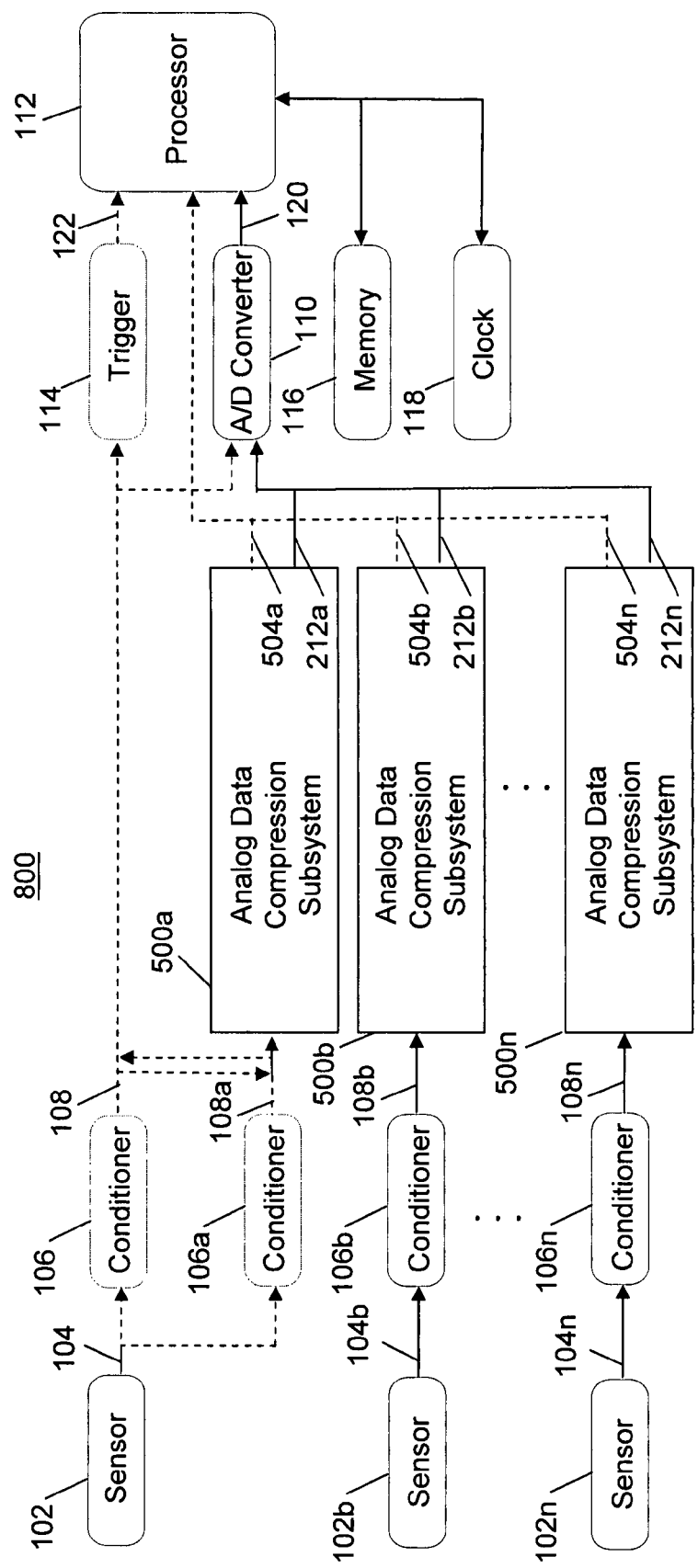
FIG. 8a depicts another alternative embodiment of an improved health monitoring system in accordance with the present invention.

FIG. 8a depicts another alternative embodiment of an improved health monitoring system 800 in accordance with the present invention. Referring to FIG. 8a, improved health monitoring system 800 is much like improved health monitoring system 700 except that additional sensors 102b through 102n are shown providing analog data signals 104b through 104n to signal conditioning circuits 106b through 106n associated with analog data compression subsystems 500b through 500n. Furthermore, as shown, analog data compression subsystem 500a can receive conditioned analog data signal 108 having been conditioned by signal conditioning circuit 106 or alternatively can receive conditioned analog data signal 108a having been conditioned by signal conditioning circuit 106a. Similarly, optional raw analog data trigger circuit 114 can receive conditioned analog data signal 108 having been conditioned by signal conditioning circuit 106 or alternatively can receive conditioned analog data signal 108a having been conditioned by signal conditioning circuit 106a. Generally, a given analog data compression subsystem 200/500/530/552/574/594 can be configured to receive any appropriately conditioned signal 108 from any appropriate signal conditioning circuit 106 having been configured to receive an analog data signal 104 from any given sensor 102. Conversely, a given sensor 102 can be configured to provide its analog data signal 104 to one or more appropriate signal conditioning circuits 106 and any appropriate signal conditioning circuit 106 can be configured to provide an appropriately conditioned signal 108 to one or more analog data compression subsystems 200/500/530/552/574/594.

Figure 8B:
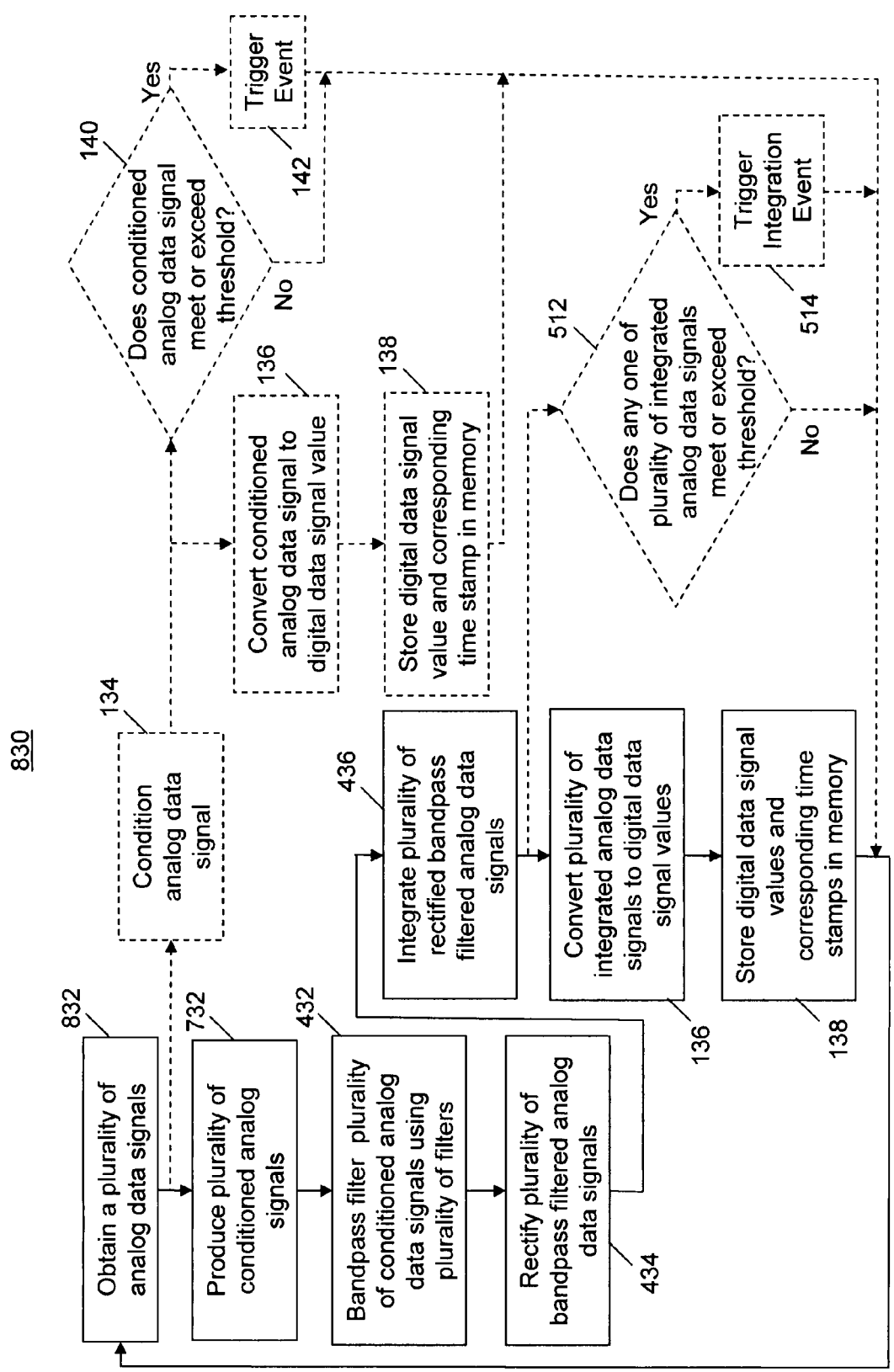
FIG. 8b depicts another alternative embodiment of an improved health monitoring method in accordance with the present invention.

FIG. 8b depicts another alternative embodiment of an improved health monitoring method 830 in accordance with the present invention. Referring to FIG. 8b, improved health monitoring method 830 is the same as improved health monitoring method 730 except for the first step 832, where a plurality of analog data signals is obtained, for example, from a plurality of sensors.

Figure 9A:
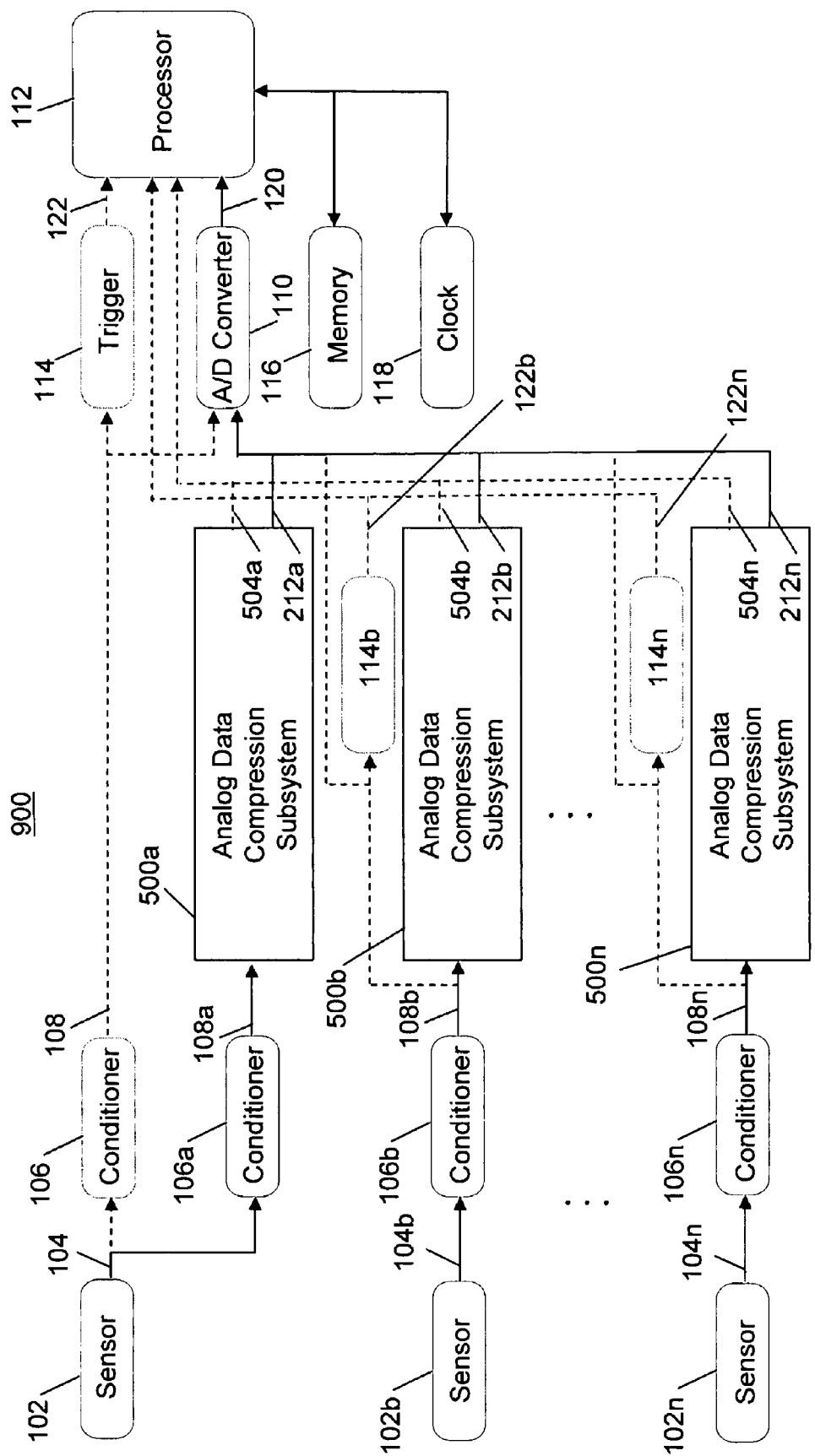
FIG. 9a depicts still another alternative embodiment of the improved health monitoring system in accordance with the present invention.

FIG. 9a depicts still another alternative embodiment of an improved health monitoring system 900 in accordance with the present invention. Referring to FIG. 9a, improved health monitoring system 900 is much like improved health monitoring system 800 except that additional optional raw analog data trigger devices 114b through 114n are shown receiving conditioned signals 108b through 108n and having raw analog data event signals 122b through 122n, which are provided to processor 112. Conditioned signals 108b through 108n are also provided to analog-to-digital converter circuit 110. As such, improved health monitoring system provides for triggered events based on raw sensor measurements and integrated sensor measurements.

Figure 9B:
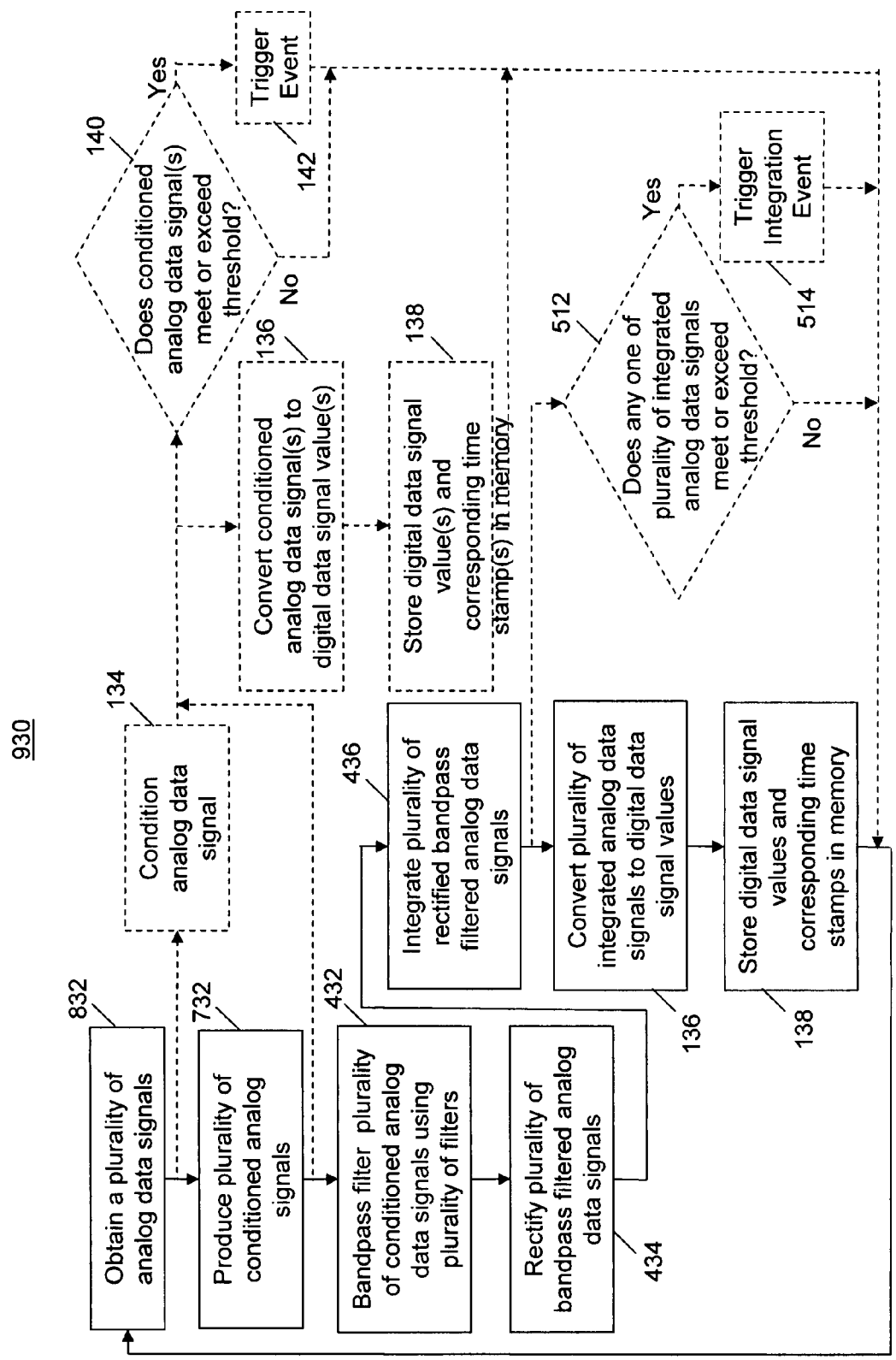
FIG. 9b depicts still another alternative embodiment of an improved health monitoring method in accordance with the present invention.

FIG. 9b depicts still another alternative embodiment of an improved health monitoring method 930 in accordance with the present invention. Referring to FIG. 9b, improved health monitoring method 930 is similar to improved health monitoring method 830 except that the plurality of conditioned analog data signals produced by step 732 can optionally be compared to a threshold(s) by step 140 and, if any one meets (or exceeds) the threshold(s), another optional step 142 is performed, which is to trigger an event(s).

Figure 10:
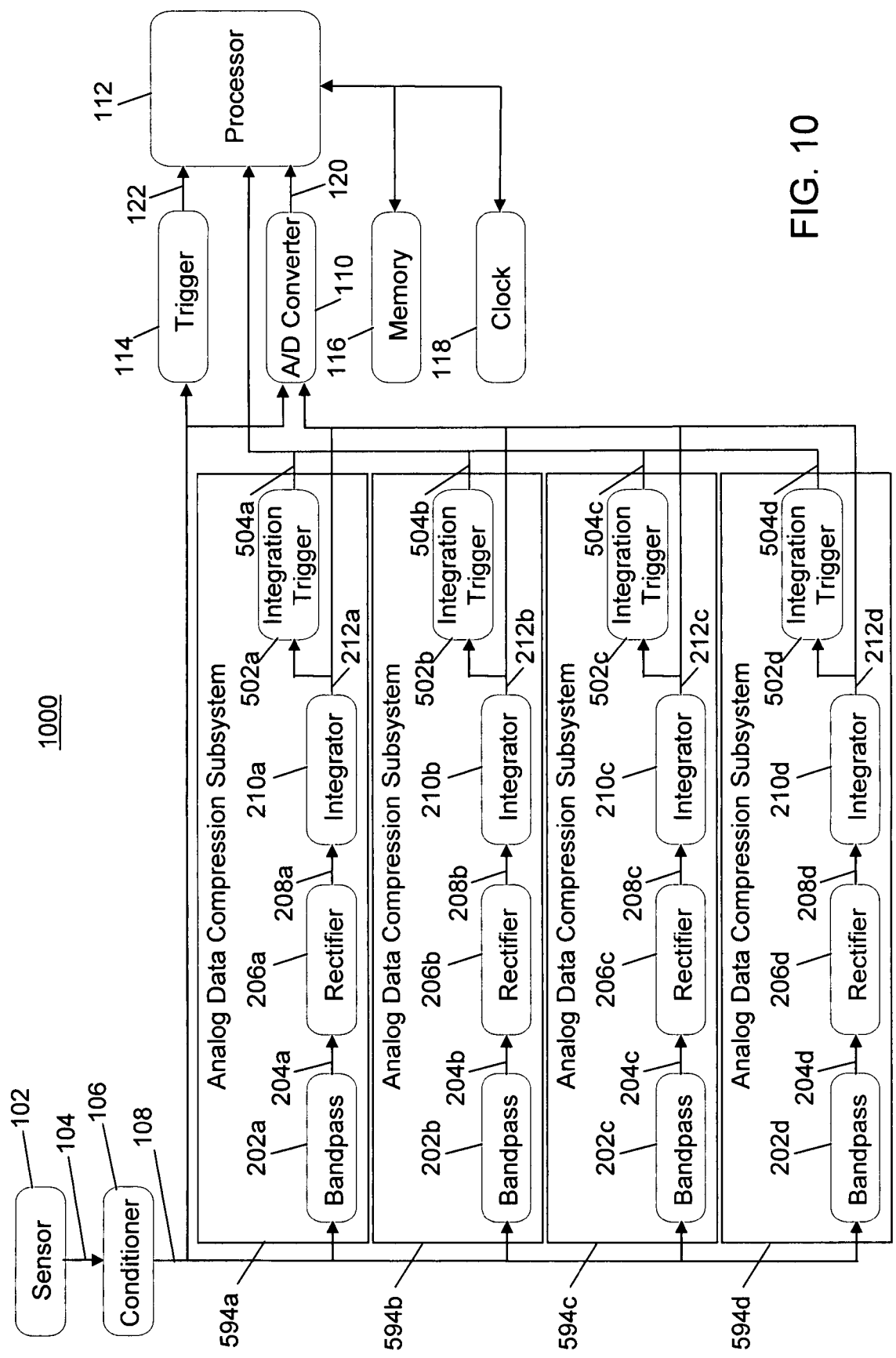
FIG. 10 depicts exemplary use of an improved health monitoring system to monitor the vibration of a helicopter tail rotor in accordance with the present invention.

FIG. 10 depicts exemplary use of an improved health monitoring system 1000 to monitor the vibration of a helicopter tail rotor in accordance with the present invention. Referring to FIG. 10, improved health monitoring system 1000 includes four analog data compression subsystems 594a through 594d placed in parallel between signal conditioning circuit 106 and analog-to-digital converter circuit 110. As such, each of analog data compression subsystems 594a through 594d receive conditioned analog data signal 108 corresponding to an analog data signal 104 produced by a piezoelectric accelerometer vibration sensor 102. Bandpass frequency filtering device 202a is a Butterworth bandpass filter having a lower cutoff frequency of 0.1 Hz and an upper cutoff frequency of 10 Hz. Bandpass frequency filtering device 202b is a Butterworth bandpass filter having a lower cutoff frequency of 10 Hz and an upper cutoff frequency of 50 Hz. Bandpass frequency filtering device 202c is a Butterworth bandpass filter having a lower cutoff frequency of 50 Hz and an upper cutoff frequency of 60 Hz. Bandpass frequency filtering device 202d is a Butterworth bandpass filter having a lower cutoff frequency of 60 Hz and an upper cutoff frequency of 400 Hz. As such, bandpass frequency filtering devices 202a through 202d analyze four different frequency bands-of-interest and produce respective bandpass filtered analog data signals 204a through 204e, which are subsequently rectified by signal rectifying devices 206a through 206d and integrated by integrators 210a through 210d to produce integrated bandpass filtered analog data signals 212a through 212d, which correspond to energies within the four different frequency bands-of-interest. Integrated bandpass filtered analog data signals 212a through 212d are converted by analog-to-digital converter circuit 110 into a digital data signals 220a through 220d that are provided to processor 112 for subsequent storage and processing. Because the digital data signals 220a through 220d provided to processor 112 have been compressed via bandpass filtering and integration in the analog domain by respective analog data compression subsystems 594a through 594d, the amount of data received by processor 112 is substantially less than would have been provided without the use of the analog data compression subsystems 594 a through 594d. Integrator devices 210a through 210d also provide integrated bandpass filtered analog data signals 212a through 212d to integrated analog data trigger devices 502a through 502d to compare integrated bandpass filtered analog data signals 212a through 212d to respective threshold values so as to trigger respective integrated analog data event signals 504a through 504d to processor 112 when any corresponding one of integrated bandpass filtered analog data signals 212a through 212d is greater than or equal to a respective threshold value. For the purposes of this example, respective threshold values are determined based on the averages and standard deviations of the respective integrated bandpass filtered analog data signals 212a through 212d such that should any of such integrated bandpass filtered analog data signals 212a through 212d deviate more than 10% outside its standard deviation a respective integrated analog data event signal 504a through 504d will be provided to processor 112.

FIG. 10 also shows direct connectivity of signal conditioning circuit 106 to analog-to-digital converter circuit 110 and direct connectivity of signal conditioning circuit 106 to raw analog data trigger device 114. As configured, when a threshold value has been determined to have been met or exceeded by the raw analog data trigger device 114, raw analog data trigger device 114 triggers a raw analog data event signal 122 to processor 112, which causes analog-to-digital converter circuit 110 to sample conditioned analog data signal 108 at a high sampling rate for some period of time so as to more precisely capture the aftermath of the triggered event. In a similar manner, when a respective threshold value has been determined to have been met or exceeded by any of the integrated analog data trigger device 502a through 502d, a corresponding integrated analog data event signal 504a through 504d is provided to processor 112, which causes analog-to-digital converter circuit 110 to sample conditioned analog data signal 108 at a high sampling rate for some period of time so as to more precisely capture the aftermath of the triggered integrated analog data event.

Figure 11A:
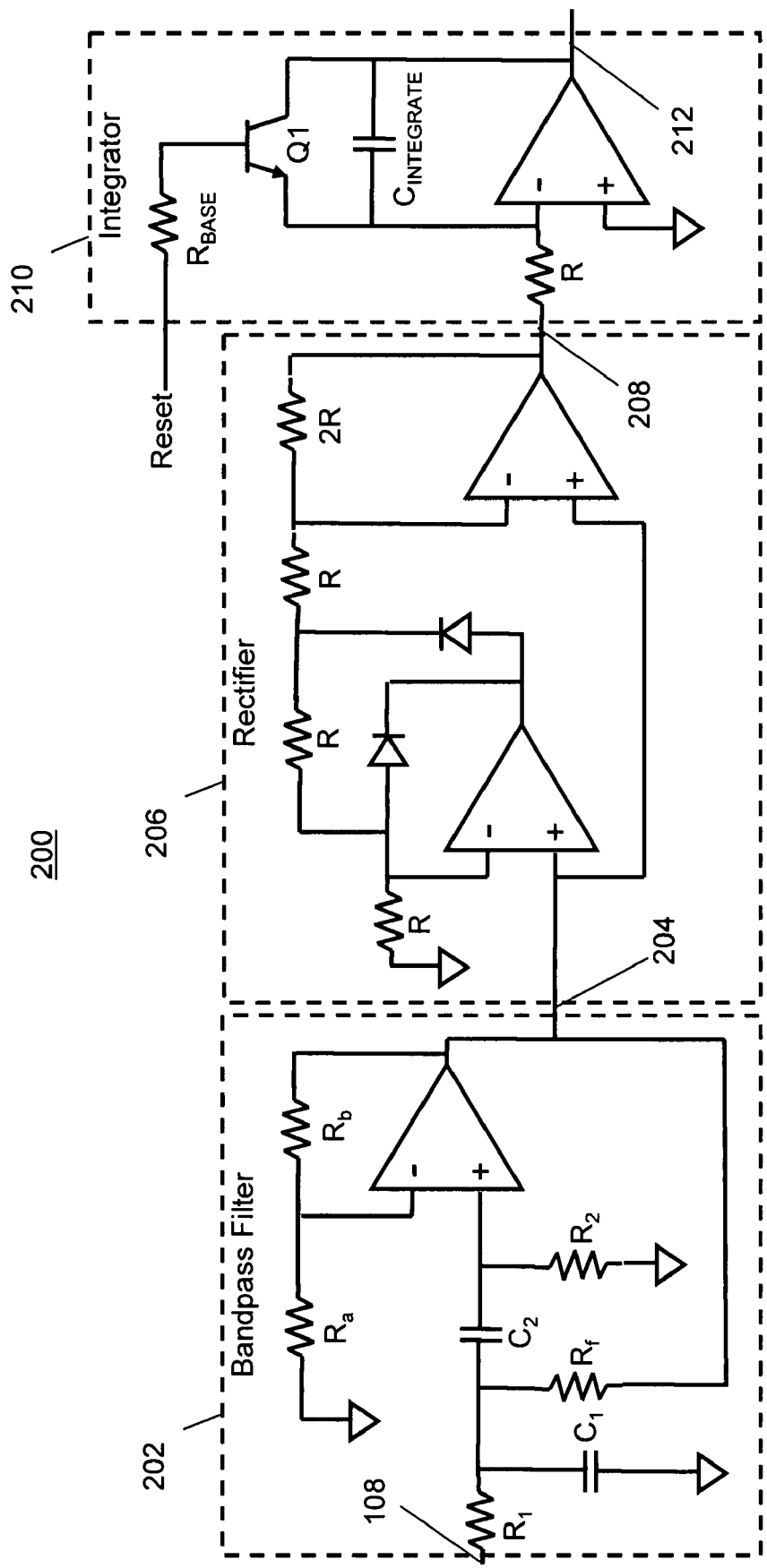
FIG. 11a depicts exemplary circuitry of an analog data compression subsystem having a resettable integrator.

FIG. 11a depicts exemplary circuitry of an analog data compression subsystem 200 having a resettable integrator. As shown, the bandpass filter circuitry 202 receives conditioned analog data signal 108 and outputs rectified bandpass filtered analog data signal 204 to rectifier circuitry 206 that outputs rectified bandpass filtered analog data signal 208 to integrator circuitry 210 that outputs integrated bandpass filtered analog data signal 212.

Figure 11B:
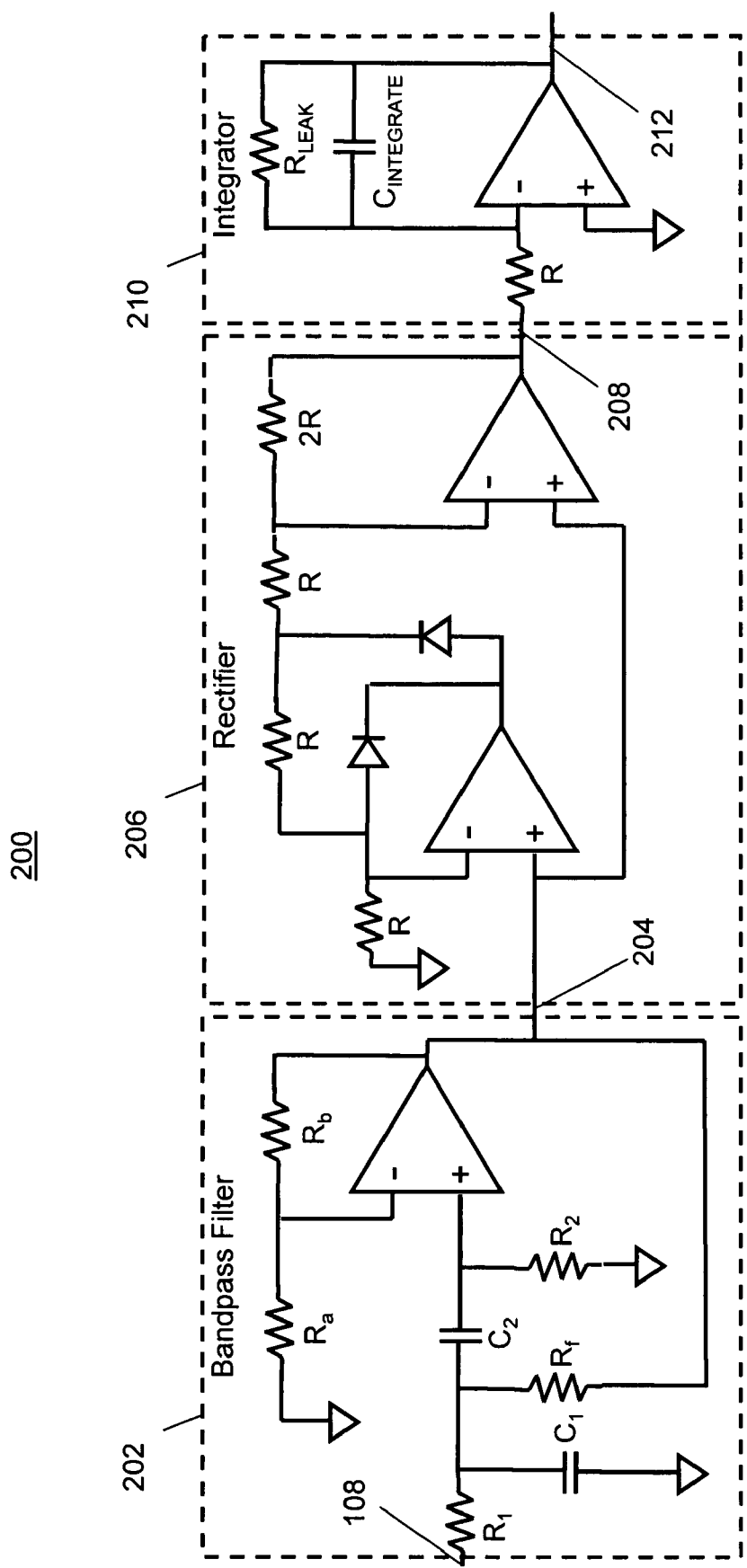
FIG. 11b depicts exemplary circuitry of an analog data compression subsystem having a leaky integrator.

FIG. 11b depicts exemplary circuitry of an analog data compression subsystem having a leaky integrator. As shown, the bandpass filter circuitry 202 receives conditioned analog data signal 108 and outputs rectified bandpass filtered analog data signal 204 to rectifier circuitry 206 that outputs rectified bandpass filtered analog data signal 208 to integrator circuitry 210 that outputs integrated bandpass filtered analog data signal 212.

In accordance with one aspect of the present invention, the bandpass frequency filter 202 can be a variable bandpass frequency filter having at least one of an adjustable lower cutoff frequency or an adjustable upper cutoff frequency. Under one arrangement, the variable bandpass frequency filter is adjusted manually. Under another arrangement, the variable bandpass frequency filter is adjusted automatically by processor 112 based on digital data signal 220 and at least one rule pertaining to at least of an acceptable value or an unacceptable value, where the digital data signal 220 corresponds to at least one of samples of conditioned analog data signal 108 or samples of integrated bandpass filtered analog data signal 212.

In accordance with another aspect of the present invention, the type of bandpass frequency filter 202 can be adjusted (or selected) either manually or automatically. For example, bandpass frequency filter 202 may be configured to function as any one of several different types of bandpass frequency filter circuits, as selected, such as a Butterworth filter or any other one of well-known bandpass frequency filter circuits. Under one arrangement, the type of bandpass frequency filter is adjusted, for example, via a manual switching process. Under another arrangement, the type of bandpass frequency filter is adjusted automatically by processor 112 based on digital data signal 220 and at least one rule, where the digital data signal 220 corresponds to at least one of samples of conditioned analog data signal 108 or samples of integrated bandpass filtered analog data signal 212.

In accordance with yet another aspect of the present invention, the number of analog data compression subsystems 200/500/530/552/574/594 in operation at a given time can be varied. Under one arrangement, the number of analog data compression subsystems 200/500/530/552/574/594 can be increased or decreased, for example, using a manual switching process. Under another arrangement, the number of analog data compression subsystems 200/500/530/552/574/594 can be increased or decreased automatically by processor 112 or by one or more other processors based on digital data signal 220 and at least one rule pertaining to at least of an acceptable value or an unacceptable value, where the digital data signal 220 corresponds to at least one of samples of conditioned analog data signal 108 or samples of integrated bandpass filtered analog data signal 212.

In accordance with still another aspect of the present invention, the sampling by analog-to-digital converter circuit 110 of integrated bandpass filtered analog data signal 212 can be based upon a desired sampling approach. Under one arrangement, integrated bandpass filtered analog data signal 212 is sampled in accordance with a constant duty cycle. Under another arrangement, integrated bandpass filtered analog data signal 212 is sampled in accordance with a variable duty cycle that can be controlled manually or automatically by processor 112 or by one or more other processors based on digital data signal 220 and at least one rule pertaining to at least of an acceptable value or an unacceptable value, where the digital data signal 220 corresponds to at least one of samples of conditioned analog data signal 108 or samples of integrated bandpass filtered analog data signal 212. A sampling approach may be adjusted based upon a priori knowledge relative to the object being monitored, for example, a bridge might be sampled at a higher rate based upon a priori knowledge of peak traffic times. A sampling approach may be adjusted based on a recognized pattern in the digital data signal 220 values. Under yet another arrangement, the sampling approach may be a function of the design of (or type of) analog-to-digital converter circuit 110. For example, digital output may be in accordance with a coding scheme other than a traditional binary coding scheme, for example, a two's complement binary coding scheme, or some other coding scheme designed to output a digital data value only when a specific pattern of the integrated bandpass filtered analog data signal 212 has been detected by analog-to-digital converter circuit 110. An analog-to-digital converter circuit 110 may be configured to only sample when integrated bandpass filtered analog data signal 212 is positive (i.e., a non-zero voltage).

In accordance with the present invention, an analog-to-digital converter circuit 110 produces an output value (or sample) in accordance with a desired sampling approach. As such, the sampling approach established for the analog-to-digital converter circuit 110 determines when and how often each integrated bandpass filtered analog data signal 212 is sampled and therefore when the corresponding analog-to-digital converter output value is stored. Moreover, by sampling integrated bandpass filtered analog data signal 212 at relatively wide sampling intervals, for example once per minute instead of sampling conditioned analog data signal 108 at a rate of tens of thousands of times a second, the amount of data sampled and stored by the improved HMS is reduced by many orders of magnitude when compared to a prior art HMS. Furthermore, the combination of bandpass frequency filtering and integration in the analog domain enables potentially problematic health conditions to be monitored without storage of large amounts of individual sensor measurements. As such, optimized sampling approaches can enable long term monitoring of a parameter associated with the health of an object (e.g., a tail rotor) to be performed with much more practical power, data storage, and data processing requirements then prior art health monitoring systems.

The practical ramifications of the low power aspect of the invention can be quite significant. For example, instead of having sensors used for health monitoring (or other types of monitoring) having a housing designed for periodic battery replacement (e.g., daily, once a month, etc.), the present invention allows much cheaper sealed housing 'throw away' sensor devices to be deployed, which due to being sealed are less susceptible to moisture, dust, shock, etc. For certain applications, costs associated with battery and/or sensor replacement can be very significant in which case having a sealed housing health monitoring system with a relatively long battery lifetime can substantially reduce current costs associated with health monitoring.

The present invention enables real-time (or substantially real-time) assessment of anomalies in the health of a system based upon long term "normal parameter characterization" determined using integrated bandpass filtered analog data measurements. Essentially, for a given frequency band-of-interest, long term statistics concerning various parameters can be established to characterize "normal" or typical parameter values of a given system. Examples of such statistics include a minimum integrated bandpass filtered analog data measurement, a maximum integrated bandpass filtered analog data measurement, an average integrated bandpass filtered analog data measurement, a mean average integrated bandpass filtered analog data measurement, a standard deviation of integrated bandpass filtered analog data measurement, etc. Such statistical values can be assessed relative to time (and date) stamps, for example, 5 am vs. 10 pm, Saturday vs. Monday, or November vs. July, and relative to other sensor information, for example, vibration between 70 and 75 degrees Fahrenheit. One skilled in the art will recognize that a multitude of statistical/mathematical models can be employed to characterize normal integrated bandpass filtered analog data behavior in relation to the health of a system being monitored.

As previously described, unacceptable integrated bandpass filtered analog data values can be used in accordance with the present invention as threshold values used to trigger events. Generally, one skilled in the art will also recognize that all sorts of rules for acceptable vs. unacceptable long term value behavior can be established and used to assess the health of an object (e.g., a helicopter rotor) so as to provide a real time (or substantially real time) indication of pending or current failure or other undesirable event. As such, a given integrated bandpass filtered analog data value may not necessarily have to meet a threshold but instead an unacceptable trend, wide data variation, or any other behavior considered abnormal by an established rule may trigger an event. Moreover, such rules can be tested (or assessed) in either the analog domain, for example using comparator circuitry, or in the digital domain by a processor.

The present invention lends itself to numerous health monitoring applications, some of which are described below as examples, which are not intended to limit the use or scope of the invention. One skilled in the art will recognize that the present invention can be used in many other applications.

Munitions Monitoring

In accordance with the present invention, missiles, land mines, mortar rounds, grenades, or any other such munitions, may be stored in a storage container, and an improved HMS associated with the munitions can be used to meet conditioned based maintenance (CBM) requirements by determining the vibrations to which the munitions have been subjected for the purpose of estimating reliability. Similarly, an improved HMS can characterize long term subjectivity to temperature, moisture, dust, or any other measured parameter.

Cargo Monitoring

In a manner similar to monitoring munitions, an improved HMS in accordance with the present invention can be used to monitor cargo placed in various types of shipping containers from crates to large containers placed on ships and railroad cars. An insurance adjuster could assess the improved HMS output to understand the vibrations, temperatures, etc. to which damaged cargo was subjected. When used with a real time clock, blame for damage could be more readily assigned based on improved HMS outputs having time stamps in conjunction with an established chain of custody of the cargo.

Crowd Monitoring

The improved HMS of the present invention can be used to optimize environments where large crowds are typically present, such as at sporting facilities, theme parks, concert facilities, parade routes, etc. Generally, use of the improved HMS allows environments to be optimized (e.g., locations of vendors, portable toilets, fencing or other barriers, police, aide stations, lighting, etc.) and also enable potential catastrophes to be avoided. For example, an improved crowd monitoring HMS used in conjunction with an improved HMS monitoring the health of a soccer coliseum could relate soccer crowd movement characteristics to stresses placed upon the coliseum infrastructure so as to identify locations that need additional bracing or other support.

Livestock Monitoring

The improved HMS of the present invention can be used to optimize environments where large quantities of livestock are present, for example, feedstock yards, pastures, large scale poultry or swine facilities, etc. As such, the locations of feeding and watering devices, fences, structures providing protection from weather, etc. can be optimized over time based on improved HMS measurements. Furthermore, once data patterns corresponding to normal livestock behavior in a given environment have been established, measured data anomalies can be used to identify a hurt or sick animal, to identify non-functioning equipment, to recognize the presence of an intruder (e.g., wolf or mountain lion), or any other undesirable event that can be determined based on a rule, thereby allowing faster response to the undesirable situation or preemptive actions.

Traffic Monitoring

The improved HMS of the present invention can be used to study long term traffic patterns so as to optimize placement and timing of traffic signals. Similar to crowd monitoring, an improved HMS can be used to optimize location of fencing or other barriers, police, aide stations, lighting, etc. and can also enable potential catastrophes to be avoided. Highway traffic can be monitored and traffic signal timing varied dynamically based upon integrated bandpass filtered analog data and established rules so as to alleviate traffic problems. Generally, the traffic control systems can be managed based upon the improved HMS of the present invention to enable them to dynamically respond to weather, traffic surges resulting from a sporting event ending, accidents, and the like so as to improve traffic flow to lower accident rates and thereby reduce associated casualties and other costs.

Unmanned Ground Sensors

The present invention enables cheap, throw away, unmanned ground sensors (UGS). An improved UGS in accordance with the present invention can use any of well known sound sensing, radar motion detection, vibration monitoring, and any other monitoring technology and various signal processing techniques to detect presence of a person, animal, vehicle, or other object within a monitored area. UGS data can convey data using wireless or wired communications systems to a control station. By employing any of various well-known position determination systems (e.g., Global Positioning System, Ultra-wideband, etc.) an area can be remotely monitored and an appropriate response to measured conditions can be managed. Because of the very high battery life of the improved HMS, unmanned ground sensors having sealed housings can be deployed over large areas so as to monitor movement of people, animals, vehicles, etc. within the areas. Such monitored areas may include areas around power plants, dams, airports, water treatment plants, pipelines, power lines, or any other area where it may be desirable to recognize presence of people, animals, vehicles, or other objects.

The improved UGS can be used in all sorts of military scenarios including monitoring prisoners captured on the battlefield, monitoring a perimeter, monitoring tank/armor movement, etc. Generally, improved UGS in accordance with the present invention can be used to monitor the movement of both friendly and unfriendly troops and integrated bandpass filtered analog data can be matched to planned military exercises to assist in identifying friend from foe. Moreover, the same or similar sensors can be distributed around a battlefield and used to monitor environmental characteristics that can adversely impact troops and equipment including temperature, moisture, dust, wind, etc. and can be used, for example, to detect presence of nuclear, biological, and chemical weapons.

Sensor fields made up of the improved UGS of the present invention could replace mine fields, where the relatively cheap, long battery-life UGS could be deployed over areas in place of mines. Such sensor fields could interact with robotic or otherwise automated weapon systems to protect and defend a restricted area. Such systems could also be used to keep persons within a detention area such as a prison or a prisoner-of-war encampment on a battlefield and to cause appropriate actions to be occur in the event of an attempted escape.

Bridge Monitoring

Figure 12:
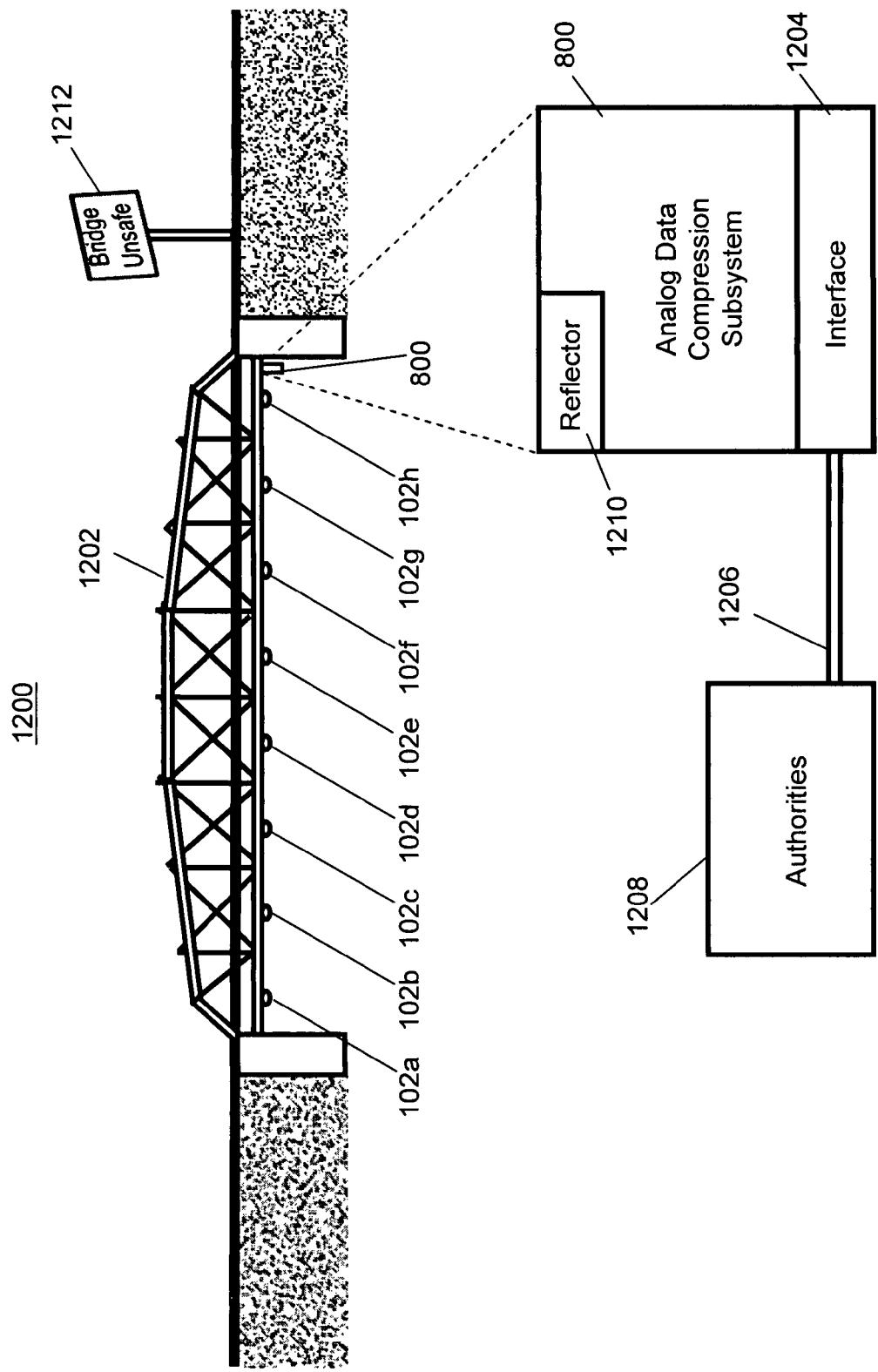
FIG. 12 illustrates an exemplary bridge health monitoring system in accordance with the present invention.

In accordance with the present invention, an improved system and method for monitoring the health of bridges can be implemented that provides authorities a real-time (or substantially real-time) warning of impending danger relative to the health of a bridge, such as a bridge over a river or gulley, a railroad truss, an overpass, or the like. Under one arrangement shown in FIG. 12 an improved bridge health monitoring system 1200 monitors various parameters associated with a bridge 1202 using various sensors 102a-102h including one or more vibration sensors or other types of sensors. Particularly, an improved HMS in accordance with the present invention, such as improved HMS 800, is used to monitor integrated bandpass filtered analog data 212a-212h received from sensors 102a-102h to provide authorities a warning of impending danger at bridge 1202. Improved HMS 800 can be used to determine normal vibration or other parameter characteristics of the bridge 1102. Under one arrangement, improved HMS 800 has an interface 1204 to a communications link 1206, for example, a land line, a cellular communications link, a satellite communications link, or some other communications link, associated with authorities 1208 responsible for safety at the bridge 1202. Under another arrangement, improved HMS 800 may interface with a modulating reflector device 1210 that can be interrogated by an interrogation device, such as a radar device, to convey information. Under still another arrangement, improved HMS 800 may interface with a warning signal device 1212, for example, a flashing light, a siren or horn, a 'bridge out' barrier, a flashing sign, or any other such warning device that can warn of impending danger and/or prevent crossing of the bridge 1202. Should integrated bandpass filtered analog data be determined to be unacceptable in accordance with the invention, improved HMS 800 would warn authorities 1208 and/or persons near the bridge 1202 of impending danger at the bridge 1202.

Moving Part Monitoring

As previously described in the helicopter rotor monitoring example, the improved HMS of the present invention can be used to monitor the condition of a moving part such as a part of a engine, a wheel, a gear, or most any other part or parts of a mechanical system. For example, an improved HMS 800 in accordance with the present invention could be associated with the wheels of a vehicle and used to provide a warning of when a tire associated with a wheel is near failing. Various engine components, for example, valves, crank, fan motor can be likewise monitored. Moreover, any of various well known energy harvesting techniques can be employed in combination with or in lieu of a battery due the lower power aspects of the invention.

Drilling Platform/Well Monitoring

The improved HMS of the present invention can be used to monitor the health of drilling platforms such as oil and natural gas platforms in the Gulf of Mexico or those based on land. In particular, the improved HMS can assess emergency conditions related to the health of a drilling platform and associated well resulting from stresses placed on the platform or well structure as a result of storms such as severe hurricanes or tornados, due to wear and tear, due to sabotage, or due to other causes. Vibration monitoring in accordance with the present invention can be used to identify cracks in weld joints resulting from metal fatigue and other causes, and can generally be used to recognize pending part failure.

Pipeline Monitoring

The improved HMS of the present invention can be used to monitor the health of an oil pipeline, or other fluid pipeline such as a gasoline pipeline, natural gas pipeline, water pipeline, etc. In particular, the improved HMS can be used to identify problems with the pipeline such as cracks in weld joints, failing support infrastructure, and other failed components of the pipeline.

Biological Monitoring

The improved HMS of the present invention can be used for biological monitoring. Generally, the HMS of the present invention enables various rules to be established based on the normal biological activity of a person (or animal) determined using integrated bandpass filtered analog data. Any of various biological parameters such as heart rhythm, brain activity, blood pressure, blood sugar level, pulse, etc. that can be measured can be assessed in real-time (or substantially real-time) to provide a warning of an undesirable biological condition and/or to affect treatment of the undesirable biological condition.

Ballast Monitoring

Various forms of transportation are susceptible to improper ballast conditions which can result from too many people or objects being on one side of a vehicle (e.g., a boat, plane, train, bus, etc.). Improper ballast can result in the vehicle wrecking or otherwise turning over. Even on a less severe basis, improper ballast can result in a rough ride, such as on a subway train that is unbalanced. In accordance with the present invention, ballast characteristics of any such form of transportation can be monitored and used to enable an automated ballast adjustment system.

Smart Crop Farming

An improved HMS in accordance with the present invention can enable smart farming where the temperature, moisture, chemicals in the ground, etc. can be monitored and optimized as necessary to improve crop yields. By being able to vary the amount of water, fertilizer, etc. applied to farm land based on rules established using integrated bandpass filtered analog data received from various sensors deployed on a farm, the yield of the farm land can be optimized.

Monitoring Amusement Park Rides

The present invention can be used to improve the safety of amusement park rides. Improved HMS's in accordance with the present invention can provide indications of when maintenance should be performed on various monitored park ride equipment thereby reducing equipment failures and increasing public safety.

Building Structure Monitoring

The present invention can be used to monitor the structure of buildings. In particular, the present invention can be used to monitor skyscrapers and other extraordinarily large structures where a failure of support infrastructure could result in a catastrophic event involving the loss of hundreds, if not thousands, of lives. Generally, normal parameters of large structures can be monitored and used to gauge the health of the structures. Should a support beam begin to fail, anomalies in the integrated bandpass filtered analog data of associated vibration or other sensors can be used to identify the pending failure in real-time (or substantially real-time). In the event of a fire in a high-rise building, historical integrated bandpass filtered analog data and newly measured integrated bandpass filtered analog data can be used to determine structural weaknesses caused by the fire and can also be used after reconstruction to verify that any structural weaknesses have been properly addressed.

Frame Monitoring

In a manner similar to moving part monitoring, an improved HMS in accordance with the invention can be associated with the infrastructure, or frame, of a vehicle or apparatus such as a car, truck, ship, plane, missile, structure, etc. to measure various parameters related to the frame. Should integrated bandpass filtered analog data result in a determination of an unacceptable parameter condition, the vehicle or apparatus can be put out of commission until proper maintenance can be performed and/or an appropriate warning can be provided, as appropriate. Various integrated bandpass filtered analog data and/or non-integrated bandpass filtered analog data may be used to determine the source of the unacceptable condition, for example, a vibration occurring in the hull of a ship might be traced to a damaged propeller of the ship.

Storm Monitoring

Improved health monitoring systems in accordance with the present invention can be distributed over large areas to measure vibrations of the ground associated with storms. As such, improved health monitoring systems can be used as an early warning system, such as a tornado early warning system, that, for example, can indicate the location and direction of an approaching tornado or other severe thunderstorm.

Levee/Dam Strain Monitoring

The present invention can be used to monitor the stress on a levee or dam. By monitoring normal stress parameters over time, the pending failure of a levee or dam given abnormal stress conditions, for example, those caused by a stage five hurricane can be assessed. As such, resources needed to shore up the levee (or dam) or to respond to needs from resulting flooding can be better managed.

While particular embodiments of the invention have been described, it will be understood, however, that the invention is not limited thereto, since modifications may be made by those skilled in the art, particularly in light of the foregoing teachings.

The invention claimed is:

1. A method for monitoring an analog data signal, said method comprising the steps of:
   receiving said analog data signal;
   bandpass filtering said analog data signal over a plurality of frequency ranges to produce a corresponding plurality of bandpass filtered analog data signals;
   rectifying said plurality of bandpass filtered analog data signals to produce a corresponding plurality of rectified bandpass filtered analog data signals;
   integrating said plurality of rectified bandpass filtered analog data signals to produce a corresponding plurality of integrated bandpass filtered analog data signals; and
   processing said plurality of integrated bandpass filtered analog data signals.

2. The method of claim 1, wherein the step of processing comprises at least one of:
   triggering at least one event when one or more of said plurality of integrated bandpass filtered analog data signals meets at least one trigger criteria;
   converting at least one of said plurality of integrated bandpass filtered analog data signals to a digital data signal comprising at least one digital data value; or
   assessing one or more of said plurality of integrated bandpass filtered analog data signals relative to a determined normal integrated bandpass filtered analog data signal behavior.

3. The method of claim 2, further comprising the step of: storing said at least one digital data value in a memory.

4. The method of claim 3, further comprising the step of: time stamping said at least one digital data value.

5. The method of claim 2, wherein said normal integrated bandpass filtered analog data signal behavior corresponds to at least one of a minimum integrated bandpass filtered analog data measurement, a maximum integrated bandpass filtered analog data measurement, an average integrated bandpass filtered analog data measurement, a mean average integrated bandpass filtered analog data measurement, or a standard deviation of integrated bandpass filtered analog data measurements.

6. The method of claim 1, further comprising the step of:
   conditioning said analog data signal prior to the step of bandpass filtering.

7. The method of claim 1, wherein said analog data signal is received from a sensor.

8. The method of claim 1, further comprising:
   varying at least one of the ranges of the plurality of frequency ranges in accordance with at least one rule corresponding to at least one of an acceptable integrated bandpass filtered analog data signal or an unacceptable integrated bandpass filtered analog data signal.

9. The method of claim 1, wherein bandpass filtering said analog data signal over the plurality of frequency ranges comprises bandpass filtering said data signal in parallel over the plurality of frequency ranges.

10. A system for monitoring an analog data signal comprising:
    a bandpass filter circuit that receives said analog data signal and produces a plurality of bandpass filtered analog data signals corresponding to a plurality of frequency ranges of interest;
    a rectifier circuit that rectifies said plurality of bandpass filtered analog data signals to produce a plurality of rectified bandpass filtered analog data signals;
    an integrator circuit that integrates said plurality of rectified bandpass filtered analog data signals to produce a plurality of integrated bandpass filtered analog data signals; and
    a processing circuit that processes said plurality of integrated bandpass filtered analog data signals.

11. The system of claim 10, further comprising at least one of:
    a trigger circuit that triggers at least one event when at least one of said plurality of integrated bandpass filtered analog data signal meets at least one trigger criteria; or
    an analog-to-digital converter circuit that converts said at least one of said plurality of integrated bandpass filtered analog data signal to a digital data signal comprising at least one digital data value.

12. The system of claim 11, further comprising:
    a memory for storing said at least one digital data value in a memory.

13. The system of claim 12, further comprising:
    a clock used for time stamping said at least one digital data value.

14. The system of claim 10, further comprising:
    a conditioning circuit for conditioned said analog signal, said analog signal being output to said bandpass filter circuit.

15. The system of claim 10, further comprising:
    a sensor that produces said analog data signal.

16. The system of claim 10, wherein said integrator circuit comprises one of a leaky integrator circuit or a resettable integrator circuit.

17. The system of claim 10, wherein said system monitors an analog signal representing a parameter relating to at least one of a munitions, a cargo, a crate, a container, a person, a crowd, a sporting facility, a theme park, a concert facility, a parade route, a coliseum, a traffic, a vehicle, an object within a monitored area, a power plant, an airport, a water treatment plant, a pipeline, a power line, a prisoner, a feedstock yard, a pasture, a poultry facility, a swine facility, an animal, an unmanned ground sensor, a bridge, a moving part, a wheel, a gear, an engine part, a fan motor, a rotor, a drilling platform, a well, a biological condition, a ballast, a farm crop, an amusement park ride, a building structure, a frame, an infrastructure, a sound, a storm, a levee, a dam, an environmental characteristic, a restricted area, a prison, a ground moisture, a presence of chemicals in the ground, a ground temperature, a nuclear weapon, a biological weapon, or a chemical weapon.

18. The system of claim 10, further comprising:

a sealed housing.

19. The system of claim 10, further comprising:

an interface to a communications link.

20. A method of monitoring an analog data signal, said method comprising the steps of:

receiving from a sensor said analog data signal;

bandpass filtering said analog data signal over a plurality of frequency ranges;

integrating said plurality of bandpass filtered analog data signal; and processing said plurality of integrated bandpass filtered analog data signal.

21. The method of claim 20, wherein the step of processing comprises at least one of:

triggering at least one event when at least one of said plurality of integrated bandpass filtered analog data signal meets at least one trigger criteria;

converting at least one of said plurality of integrated bandpass filtered analog data signal to a digital data signal comprising at least one digital data value; or assessing at least one of said plurality of integrated bandpass filtered analog data signal relative to a determined normal integrated bandpass filtered analog data signal behavior.

* * * * *